(12) United States Patent
Jobs et al.

(10) Patent No.: US 7,889,497 B2
(45) Date of Patent: Feb. 15, 2011

(54) HIGHLY PORTABLE MEDIA DEVICE

(75) Inventors: Steve Jobs, Palo Alto, CA (US);
Anthony M. Fadell, Portola Valley, CA (US); Jonathan P. Ive, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 727 days.

(21) Appl. No.: 11/830,746

(22) Filed: Jul. 30, 2007

(65) Prior Publication Data

US 2008/0013274 A1    Jan. 17, 2008

Related U.S. Application Data

(63) Continuation of application No. 11/212,313, filed on Aug. 24, 2005, now Pat. No. 7,593,782.

(60) Provisional application No. 60/642,276, filed on Jan. 7, 2005.

(51) Int. Cl.
*H05K 5/00* (2006.01)
*H05K 7/00* (2006.01)

(52) U.S. Cl. ................ 361/679.56; 361/679.1

(58) Field of Classification Search ............ 361/679.1, 361/679.01, 679.56; 200/5 R, 9
See application file for complete search history.

(56) References Cited

U.S. PATENT DOCUMENTS

| | | | |
|---|---|---|---|
| 4,090,216 A | 5/1978 | Constable | |
| 4,386,345 A | 5/1983 | Narveson et al. | |
| 4,451,849 A | 5/1984 | Fuhrer | |
| 4,589,022 A | 5/1986 | Prince et al. | |
| 4,908,523 A | 3/1990 | Snowden et al. | |
| 4,928,307 A | 5/1990 | Lynn | |
| 4,951,171 A | 8/1990 | Tran et al. | |
| 5,185,906 A | 2/1993 | Brooks | |

(Continued)

FOREIGN PATENT DOCUMENTS

DE    43 34 773 A1    4/1994

(Continued)

OTHER PUBLICATIONS

"Creative Nomad MuVo TX," www.creative.com, Nov. 1, 2004 as per http://web.archive.org/web [downloaded Jun. 6, 2006].

(Continued)

*Primary Examiner*—Jayprakash N Gandhi
*Assistant Examiner*—Anthony M Haughton
(74) *Attorney, Agent, or Firm*—Beyer Law Group LLP

(57) ABSTRACT

An improved portable media device and methods for operating a media device are disclosed. According to one aspect, the portable media device can also function as a solid-state drive for data storage. The form factor of the portable media device can be hand-held or smaller, such that it is highly portable. The portable media device can use one or more status indicators. The portable media device can also include a peripheral bus connector, a rechargeable battery, and one or more input devices. According to another aspect, the portable media device has the capability to store media device status information in persistent memory before powering down. Thereafter, when the portable media device is again powered up, the stored media player status information can be retrieved and utilized. According to still another aspect, the portable media device can form and/or traverse a media asset playlist in an efficient manner.

19 Claims, 17 Drawing Sheets

U.S. PATENT DOCUMENTS

| | | |
|---|---|---|
| 5,293,494 A | 3/1994 | Saito et al. |
| 5,379,057 A | 1/1995 | Clough |
| 5,406,305 A | 4/1995 | Shimomura et al. |
| 5,559,945 A | 9/1996 | Beaudet et al. |
| 5,566,337 A | 10/1996 | Szymanski et al. |
| 5,583,993 A | 12/1996 | Foster et al. |
| 5,608,698 A | 3/1997 | Yamanoi et al. |
| 5,616,876 A | 4/1997 | Cluts |
| 5,617,386 A | 4/1997 | Choi |
| 5,670,985 A | 9/1997 | Cappels, Sr. et al. |
| 5,675,362 A | 10/1997 | Clough |
| 5,684,513 A | 11/1997 | Decker |
| 5,710,922 A | 1/1998 | Alley et al. |
| 5,712,949 A | 1/1998 | Kato et al. |
| 5,717,422 A | 2/1998 | Fergason |
| 5,721,949 A | 2/1998 | Smith et al. |
| 5,726,672 A | 3/1998 | Hernandez et al. |
| 5,739,451 A | 4/1998 | Winksy et al. |
| 5,740,143 A | 4/1998 | Suetomi |
| 5,760,588 A | 6/1998 | Bailey |
| 5,778,374 A | 7/1998 | Dang et al. |
| 5,803,786 A | 9/1998 | McCormick |
| 5,815,225 A | 9/1998 | Nelson |
| 5,822,288 A | 10/1998 | Shinada |
| 5,835,721 A | 11/1998 | Donahue et al. |
| 5,835,732 A | 11/1998 | Kikinis et al. |
| 5,838,969 A | 11/1998 | Jacklin et al. |
| 5,864,868 A | 1/1999 | Contois |
| 5,867,163 A | 2/1999 | Kurtenbach |
| 5,870,710 A | 2/1999 | Ozawa et al. |
| 5,918,303 A | 6/1999 | Yamaura et al. |
| 5,920,728 A | 7/1999 | Hallowell et al. |
| 5,923,757 A | 7/1999 | Hocker et al. |
| 5,952,992 A | 9/1999 | Helms |
| 6,006,274 A | 12/1999 | Hawkins et al. |
| 6,009,237 A | 12/1999 | Hirabayashi et al. |
| 6,011,585 A | 1/2000 | Anderson |
| 6,018,705 A | 1/2000 | Gaudet et al. |
| 6,041,023 A | 3/2000 | Lakhansingh |
| 6,052,654 A | 4/2000 | Gaudet et al. |
| 6,108,426 A | 8/2000 | Stortz |
| 6,122,340 A | 9/2000 | Darley et al. |
| 6,158,019 A | 12/2000 | Squibb |
| 6,161,944 A | 12/2000 | Leman |
| 6,172,948 B1 | 1/2001 | Keller et al. |
| 6,179,432 B1 | 1/2001 | Zhang et al. |
| 6,185,163 B1 | 2/2001 | Bickford et al. |
| 6,191,939 B1 | 2/2001 | Burnett |
| 6,208,044 B1 | 3/2001 | Viswanadham et al. |
| 6,216,131 B1 | 4/2001 | Liu et al. |
| 6,217,183 B1 | 4/2001 | Shipman |
| 6,248,946 B1 | 6/2001 | Dwek |
| 6,295,541 B1 | 9/2001 | Bodnar et al. |
| 6,297,795 B1 | 10/2001 | Kato et al. |
| 6,298,314 B1 | 10/2001 | Blackadar et al. |
| 6,332,175 B1 | 12/2001 | Birrell et al. |
| 6,336,365 B1 | 1/2002 | Blackadar et al. |
| 6,336,727 B1 | 1/2002 | Kim |
| 6,341,316 B1 | 1/2002 | Kloba et al. |
| 6,357,147 B1 | 3/2002 | Darley et al. |
| 6,377,530 B1 | 4/2002 | Burrows |
| 6,452,610 B1 | 9/2002 | Reinhardt et al. |
| 6,467,924 B2 | 10/2002 | Shipman |
| 6,493,652 B1 | 12/2002 | Ohlenbusch et al. |
| 6,536,139 B2 | 3/2003 | Darley et al. |
| 6,549,497 B2 | 4/2003 | Miyamoto et al. |
| 6,560,903 B1 | 5/2003 | Darley |
| 6,587,403 B1 | 7/2003 | Keller et al. |
| 6,587,404 B1 | 7/2003 | Keller et al. |
| 6,605,038 B1 | 8/2003 | Teller et al. |
| 6,606,281 B2 | 8/2003 | Cowgill et al. |
| 6,611,607 B1 | 8/2003 | Davis et al. |
| 6,611,789 B1 | 8/2003 | Darley |
| 6,617,963 B1 | 9/2003 | Watters et al. |
| 6,621,768 B1 | 9/2003 | Keller et al. |
| 6,623,427 B2 | 9/2003 | Mandigo |
| 6,631,101 B1 | 10/2003 | Chan et al. |
| 6,693,612 B1 | 2/2004 | Matsumoto et al. |
| 6,731,312 B2 | 5/2004 | Robbin |
| 6,760,536 B1 | 7/2004 | Amir et al. |
| 6,762,741 B2 | 7/2004 | Weindorf |
| 6,781,611 B1 | 8/2004 | Richard |
| 6,794,566 B2 | 9/2004 | Pachet |
| 6,799,226 B1 | 9/2004 | Robbin et al. |
| 6,801,964 B1 | 10/2004 | Mahdavi |
| 6,832,373 B2 | 12/2004 | O'Neill |
| 6,844,511 B1 * | 1/2005 | Hsu et al. .................. 200/6 A |
| 6,870,529 B1 | 3/2005 | Davis |
| 6,871,063 B1 | 3/2005 | Schiffer |
| 6,876,947 B1 | 4/2005 | Darley et al. |
| 6,882,955 B1 | 4/2005 | Ohlenbusch et al. |
| 6,886,749 B2 | 5/2005 | Chiba et al. |
| 6,898,550 B1 | 5/2005 | Blackadar et al. |
| 6,911,971 B2 | 6/2005 | Suzuki et al. |
| 6,918,677 B2 | 7/2005 | Shipman |
| 6,931,377 B1 | 8/2005 | Seya |
| 6,934,812 B1 | 8/2005 | Robbin et al. |
| 6,950,087 B2 | 9/2005 | Knox et al. |
| 7,010,365 B2 | 3/2006 | Maymudes |
| 7,028,096 B1 | 4/2006 | Lee |
| 7,046,230 B2 | 5/2006 | Zadesky |
| 7,062,225 B2 | 6/2006 | White |
| 7,070,349 B2 * | 7/2006 | Dombrowski et al. ....... 400/490 |
| 7,076,561 B1 | 7/2006 | Rosenberg et al. |
| 7,084,856 B2 | 8/2006 | Huppi |
| 7,084,921 B1 | 8/2006 | Ogawa |
| 7,092,946 B2 | 8/2006 | Bodnar |
| 7,124,125 B2 | 10/2006 | Cook et al. |
| 7,131,059 B2 | 10/2006 | Obrador |
| 7,143,241 B2 | 11/2006 | Hull |
| 7,146,437 B2 | 12/2006 | Robbin et al. |
| 7,171,331 B2 | 1/2007 | Vock et al. |
| 7,191,244 B2 | 3/2007 | Jennings et al. |
| 7,213,228 B2 | 5/2007 | Putterman et al. |
| 7,234,026 B2 | 6/2007 | Robbin et al. |
| 7,277,928 B2 | 10/2007 | Lennon |
| 7,301,857 B2 | 11/2007 | Shah et al. |
| 7,356,679 B1 | 4/2008 | Le et al. |
| 7,508,535 B2 | 3/2009 | Hart et al. |
| 2001/0013983 A1 | 8/2001 | Izawa et al. |
| 2001/0029178 A1 | 10/2001 | Criss et al. |
| 2001/0037367 A1 | 11/2001 | Iyer |
| 2001/0041021 A1 | 11/2001 | Boyle et al. |
| 2001/0042107 A1 | 11/2001 | Palm |
| 2002/0002413 A1 | 1/2002 | Tokue |
| 2002/0013784 A1 | 1/2002 | Swanson |
| 2002/0028683 A1 | 3/2002 | Banatre et al. |
| 2002/0045961 A1 | 4/2002 | Gibbs et al. |
| 2002/0046315 A1 | 4/2002 | Miller et al. |
| 2002/0055934 A1 | 5/2002 | Lipscomb et al. |
| 2002/0059440 A1 | 5/2002 | Hudson et al. |
| 2002/0059499 A1 | 5/2002 | Hudson |
| 2002/0090912 A1 | 7/2002 | Cannon et al. |
| 2002/0116082 A1 | 8/2002 | Gudorf |
| 2002/0116517 A1 | 8/2002 | Hudson et al. |
| 2002/0122031 A1 | 9/2002 | Maglio et al. |
| 2002/0123359 A1 | 9/2002 | Wei et al. |
| 2002/0152045 A1 | 10/2002 | Dowling et al. |
| 2002/0156833 A1 | 10/2002 | Maurya et al. |
| 2002/0161865 A1 | 10/2002 | Nguyen |
| 2002/0173273 A1 | 11/2002 | Spurgat et al. |
| 2002/0189426 A1 | 12/2002 | Hirade et al. |
| 2002/0189429 A1 | 12/2002 | Qian et al. |
| 2002/0199043 A1 | 12/2002 | Yin |

| | | |
|---|---|---|
| 2003/0002688 A1 | 1/2003 | Kanevsky et al. |
| 2003/0007001 A1 | 1/2003 | Zimmerman |
| 2003/0018799 A1 | 1/2003 | Eyal |
| 2003/0037254 A1 | 2/2003 | Fischer et al. |
| 2003/0046434 A1 | 3/2003 | Flanagin et al. |
| 2003/0050092 A1 | 3/2003 | Yun |
| 2003/0074457 A1 | 4/2003 | Kluth |
| 2003/0076301 A1 | 4/2003 | Tsuk et al. |
| 2003/0076306 A1 | 4/2003 | Zadesky |
| 2003/0079038 A1 | 4/2003 | Robbin et al. |
| 2003/0095096 A1 | 5/2003 | Robbin et al. |
| 2003/0097379 A1 | 5/2003 | Ireton |
| 2003/0104835 A1 | 6/2003 | Douhet |
| 2003/0127307 A1* | 7/2003 | Liu et al. ............... 200/5 R |
| 2003/0128192 A1 | 7/2003 | van Os |
| 2003/0133694 A1 | 7/2003 | Yeo |
| 2003/0153213 A1 | 8/2003 | Siddiqui et al. |
| 2003/0156503 A1 | 8/2003 | Schilling et al. |
| 2003/0167318 A1 | 9/2003 | Robbin et al. |
| 2003/0176935 A1 | 9/2003 | Lian et al. |
| 2003/0182100 A1 | 9/2003 | Plastina et al. |
| 2003/0221541 A1 | 12/2003 | Platt |
| 2003/0229490 A1 | 12/2003 | Etter |
| 2003/0236695 A1 | 12/2003 | Litwin, Jr. |
| 2004/0001395 A1 | 1/2004 | Keller et al. |
| 2004/0001396 A1 | 1/2004 | Keller et al. |
| 2004/0012556 A1 | 1/2004 | Yong et al. |
| 2004/0055446 A1 | 3/2004 | Robbin et al. |
| 2004/0066363 A1 | 4/2004 | Yamano et al. |
| 2004/0069122 A1 | 4/2004 | Wilson |
| 2004/0076086 A1 | 4/2004 | Keller |
| 2004/0086120 A1 | 5/2004 | Akins, III et al. |
| 2004/0094018 A1 | 5/2004 | Ueshima et al. |
| 2004/0103411 A1 | 5/2004 | Thayer |
| 2004/0125522 A1 | 7/2004 | Chiu et al. |
| 2004/0165302 A1 | 8/2004 | Lu |
| 2004/0177063 A1 | 9/2004 | Weber et al. |
| 2004/0198436 A1 | 10/2004 | Alden |
| 2004/0210628 A1 | 10/2004 | Inkinen et al. |
| 2004/0216108 A1 | 10/2004 | Robbin |
| 2004/0224638 A1 | 11/2004 | Fadell et al. |
| 2004/0242224 A1 | 12/2004 | Janik et al. |
| 2004/0246275 A1 | 12/2004 | Yoshihara et al. |
| 2004/0255135 A1 | 12/2004 | Kitaya et al. |
| 2004/0267825 A1 | 12/2004 | Novak et al. |
| 2005/0015254 A1 | 1/2005 | Beaman |
| 2005/0053365 A1 | 3/2005 | Adams et al. |
| 2005/0060240 A1 | 3/2005 | Popofsky |
| 2005/0060542 A1 | 3/2005 | Risan et al. |
| 2005/0108754 A1 | 5/2005 | Carhart et al. |
| 2005/0111820 A1 | 5/2005 | Matsumi et al. |
| 2005/0122315 A1 | 6/2005 | Chalk et al. |
| 2005/0123886 A1 | 6/2005 | Hua et al. |
| 2005/0146534 A1 | 7/2005 | Fong et al. |
| 2005/0149213 A1 | 7/2005 | Guzak et al. |
| 2005/0152294 A1 | 7/2005 | Yu et al. |
| 2005/0156047 A1 | 7/2005 | Chiba et al. |
| 2005/0160270 A1 | 7/2005 | Goldberg et al. |
| 2005/0166153 A1 | 7/2005 | Eytchison et al. |
| 2005/0216855 A1 | 9/2005 | Kopra et al. |
| 2005/0218303 A1 | 10/2005 | Poplin |
| 2005/0234983 A1 | 10/2005 | Plastina et al. |
| 2005/0245839 A1 | 11/2005 | Stivoric et al. |
| 2005/0246324 A1 | 11/2005 | Paalasmaa et al. |
| 2005/0248555 A1 | 11/2005 | Feng et al. |
| 2005/0257169 A1 | 11/2005 | Tu |
| 2005/0259064 A1 | 11/2005 | Sugino et al. |
| 2005/0259524 A1 | 11/2005 | Yeh |
| 2005/0270276 A1 | 12/2005 | Sugimoto et al. |
| 2006/0013414 A1 | 1/2006 | Shih |
| 2006/0025068 A1 | 2/2006 | Regan et al. |
| 2006/0026424 A1 | 2/2006 | Eto |
| 2006/0061563 A1 | 3/2006 | Fleck |
| 2006/0068760 A1 | 3/2006 | Hameed et al. |
| 2006/0071899 A1 | 4/2006 | Chang et al. |
| 2006/0088228 A1 | 4/2006 | Marriott et al. |
| 2006/0092122 A1 | 5/2006 | Yoshihara et al. |
| 2006/0094409 A1 | 5/2006 | Inselberg |
| 2006/0095502 A1 | 5/2006 | Lewis et al. |
| 2006/0098320 A1 | 5/2006 | Koga et al. |
| 2006/0135883 A1 | 6/2006 | Jonsson et al. |
| 2006/0145053 A1 | 7/2006 | Stevenson et al. |
| 2006/0152382 A1 | 7/2006 | Hiltunen |
| 2006/0155914 A1 | 7/2006 | Jobs et al. |
| 2006/0170535 A1 | 8/2006 | Watters et al. |
| 2006/0173974 A1 | 8/2006 | Tang |
| 2006/0190577 A1 | 8/2006 | Yamada |
| 2006/0190980 A1 | 8/2006 | Kikkoji et al. |
| 2006/0221057 A1 | 10/2006 | Fux et al. |
| 2006/0221788 A1 | 10/2006 | Lindahl et al. |
| 2006/0259758 A1 | 11/2006 | Deng et al. |
| 2006/0265503 A1 | 11/2006 | Jones et al. |
| 2006/0272483 A1 | 12/2006 | Honeywell |
| 2006/0277336 A1 | 12/2006 | Lu et al. |
| 2007/0014536 A1 | 1/2007 | Hellman |
| 2007/0028009 A1 | 2/2007 | Robbin et al. |
| 2007/0061759 A1 | 3/2007 | Klein, Jr. |
| 2007/0089057 A1 | 4/2007 | Kindig |
| 2007/0106660 A1 | 5/2007 | Stern et al. |
| 2007/0124679 A1 | 5/2007 | Jeong et al. |
| 2007/0129062 A1 | 6/2007 | Pantalone et al. |
| 2007/0135225 A1 | 6/2007 | Nieminen et al. |
| 2007/0248311 A1 | 10/2007 | Wice et al. |
| 2007/0255163 A1 | 11/2007 | Prineppi |
| 2008/0055228 A1 | 3/2008 | Glen |
| 2008/0134287 A1 | 6/2008 | Gudorf et al. |
| 2010/0077338 A1 | 3/2010 | Matthews et al. |

FOREIGN PATENT DOCUMENTS

| | | |
|---|---|---|
| DE | 44 45 023 A1 | 6/1996 |
| EP | 0 127 139 | 5/1984 |
| EP | 0578604 | 1/1994 |
| EP | 0 757 437 | 2/1997 |
| EP | 0 813 138 | 12/1997 |
| EP | 0 863 469 | 9/1998 |
| EP | 0 917 077 | 5/1999 |
| EP | 0 982 732 | 3/2000 |
| EP | 1 028 425 | 8/2000 |
| EP | 1028426 A2 | 8/2000 |
| EP | 1 076 302 | 2/2001 |
| EP | 1 213 643 | 6/2002 |
| EP | 1 289 197 | 3/2003 |
| EP | 1 503 363 | 2/2005 |
| EP | 1536612 | 6/2005 |
| EP | 1 566 743 | 8/2005 |
| EP | 1566948 | 8/2005 |
| EP | 1 372 133 | 12/2005 |
| EP | 1 686 496 | 8/2006 |
| GB | 2 370 208 | 6/2002 |
| GB | 2384399 | 7/2003 |
| GB | 2399639 | 5/2005 |
| JP | 59-023610 | 2/1984 |
| JP | 03-228490 | 10/1991 |
| JP | 04-243386 | 8/1992 |
| JP | 6-96520 | 4/1994 |
| JP | 8-235774 | 9/1996 |
| JP | 9-50676 | 2/1997 |
| JP | 9-259532 | 10/1997 |
| JP | 2000-90651 | 3/2000 |
| JP | 2000-224099 | 8/2000 |
| JP | 2000-285643 | 10/2000 |
| JP | 2000-299834 | 10/2000 |
| JP | 2000-311352 | 11/2000 |
| JP | 2000-339864 | 12/2000 |
| JP | 2001-067794 | 3/2001 |

| | | |
|---|---|---|
| JP | 2001-236286 | 8/2001 |
| JP | 2001-312338 | 11/2001 |
| JP | 2002-076977 | 3/2002 |
| JP | 2002-175467 | 6/2002 |
| JP | 2003-188792 | 7/2003 |
| JP | 2003-259333 | 9/2003 |
| JP | 2003-319365 | 11/2003 |
| JP | 2004-021720 | 1/2004 |
| JP | 2004-219731 | 8/2004 |
| JP | 2004-220420 | 8/2004 |
| KR | 20010076508 | 8/2001 |
| WO | WO 01/33569 | 6/1995 |
| WO | WO 95/16950 | 6/1995 |
| WO | 98/17032 | 4/1998 |
| WO | WO 99/28813 | 6/1999 |
| WO | WO 00/22820 | 4/2000 |
| WO | WO 01/65413 | 9/2001 |
| WO | WO 01/67753 | 9/2001 |
| WO | WO 02/25610 | 3/2002 |
| WO | WO 03/023786 | 3/2003 |
| WO | WO 03/036457 | 5/2003 |
| WO | WO 03/067202 | 8/2003 |
| WO | 03/085670 | 10/2003 |
| WO | 2004/061850 A1 | 7/2004 |
| WO | WO 2004/055637 | 7/2004 |
| WO | WO 2004/084413 A2 | 9/2004 |
| WO | 2004/098079 | 11/2004 |
| WO | WO 2004/104815 | 12/2004 |
| WO | WO 2005/031737 | 4/2005 |
| WO | 05/048644 | 5/2005 |
| WO | WO 2005/008505 | 7/2005 |
| WO | 2005/109781 | 11/2005 |
| WO | WO 2006/040737 | 4/2006 |
| WO | 2006/071364 | 6/2006 |

OTHER PUBLICATIONS

T3-"Creative MuVo TX 256 MB," T3 Magazine, Aug. 17, 2004, http://www.t3.co.uk/reviews/entertainment/mp3_player/creative_muvo_tx_25 6mb [downloaded Jun. 6, 2006].
Lewis, "Two New Ways to Buy Your Bits," CNN Money, Dec. 31, 2003, pp. 1-4.
"Creative Digital MP3 Player," www.creative.com, Nov. 1, 2004 as per http://web.archive.org/ [downloaded Jun. 7, 2006].
Invitation to Pay Additional Fees and Partial Search Report for corresponding PCT Application No. PCT/US2005/04797, dated Jul. 3, 2006.
"Creative NOMAD MuVo," www.creative.com, Nov. 1, 2004 as per http://webarchive.org/ [downloaded Jun. 7, 2006].
Veiga, "AT&T Wireless Launching Music Service,"Yahoo! Finance, Oct. 5, 2004, pp. 1-2.
Int'l Application No. PCT/US2005/046797, Written Opinion of the International Searching Authority; Jul. 1, 2005.
PCT/US2005/046797; International Search Report; Nov. 24, 2006.
"Apple Announces iTunes 2," Press Release, Apple Computer, Inc., Oct. 23, 2001.
"Apple Introduces iTunes—World's Best and Easiest to Use Jukebox Software," Macworld Expo, San Francisco, Jan. 9, 2001.
"Apple's iPod Available in Stores Tomorrow," Press Release, Apple Computer, Inc., Nov. 9, 2001.
"Nomad Jukebox," User Guide, Creative Technology Ltd., Version 1, Aug. 2000.
"SoundJam MP Plus Manual, version 2.0"—MP3 Player and Encoder for Macintosh by Jeffrey Robbin, Bill Kincaid and Dave Heller, manual by Tom Negrino, published by Casady & Greene, Inc., 2000.
"12.1" 925 Candela Mobile PC", downloaded from LCDHardware.com on Dec. 19, 2002, http://www.lcdharware.com/panel/12_1_panel/default.asp.
"BL82 Series Backlit Keyboards", www.tg3electrons.com/products/backlit/backlit.htm, downloaded Dec. 19, 2002.
"Bluetooth PC Headsets—Enjoy Wireless VoIP Conversations: 'Connecting' Your Bluetooth Headset With Your Computer",
Bluetooth PC Headsets; downloaded on Apr. 29, 2006 from http://www.bluetoothpcheadsets.com/connect.htm.
"Digital Still Cameras—Downloading Images to a Computer," Mimi Chakarova et al., Multi-Media Reporting and Convergence, 2 pgs.
"Eluminx Illuminated Keyboard", downloaded Dec. 19, 2002, http://www.elumix.com/.
"How to Pair a Bluetooth Headset & Cell Phone", About.com; downloaded on Apr. 29, 2006 from http://mobileoffice.about.com/od/usingyourphone/ht/blueheadset_p.htm.
"Peripherals for Industrial Keyboards & Pointing Devices", Stealth Computer Corporation, downloaded on Dec. 19, 2002, http://www,stealthcomputer,com/peropherals_oem.htm.
"Poly-Optical Fiber Optic Membrane Switch Backlighting", downloaded Dec. 19, 2002, http://www.poly-optical.com/membrane_switches.html.
"Public Safety Technologies Tracer 2000 Computer", downloaded Dec. 19, 2002, http://www.pst911.com/traver.html.
"QuickTime Movie Playback Programming Guide", Apple Computer, Inc., Aug. 11, 2005.
"QuickTime Overview", Apple Computer, Inc., Aug. 11, 2005.
"Rocky Matrix Backlit Keyboard", downloaded Dec. 19, 2002, http://www.amrel.con/asi_matrixkeyboard.html.
"Sony Ericsson to introduce Auto pairing to improve Bluetooth connectivity between headsets and phones", Sep. 28, 2005 Press Release, Sony Ericsson Corporate; downloaded on Apr. 29, 2006 from http://www.sonyericsson.com/spg.j  sp?cc=global&lc=en&ver=4001&template=pc3_1_1&z... .
"TAOS, Inc., Announces Industry's First Ambient Light Sensor to Convert Light Intensity to Digital Signals", www.taosinc.com/pressrelease_090902.htm downloaded Jan. 23, 2003.
"Toughbook 28: Powerful, Rugged and Wireless", Panasonic: Toughbook Models, downloaded Dec. 19, 2002, http:www.panasonic.com/computer/notebook/html/01a_s8.htm.
"When it Comes to Selecting a Projection TV, Toshiba Makes Everything Perfectly Clear, Previews of New Releases", www.bestbuy.com/HomeAudioVideo/Specials/ToshibaTVFeatures.asp, downloaded Jan. 23, 2003.
"WhyBuy: Think Pad", IBM ThinkPad Web Page Ease of Use, downloaded on Dec. 19, 2002, http://www.pc.ibm.com/us/thinkpad/easeofuse.html.
512MB Waterproof MP3 Player with FM Radio & Built-in Pedometer, Oregon Scientific, downloaded on Jul. 31, 2006 from http://www2.oregonscientific.com/shop/productasp?cid=4&scid=1_1&pid=581.
Adam C. Engst, "SoundJam Keeps on Jammin," Jun. 19, 2000, http://db.tidbits.com/getbits.acgi?tbart=05988.
Andrew Birrell, "Personal Jukebox (PJB)," Oct. 13, 2000, http://birrell.org/andrew/talks/pjb-overview.ppt.
Apple iPod Technical Specifications, iPod 20GB and 60GB Mac + PC, downloaded from http://www.apple.com/ipod/color/specs.html on Aug. 8, 2005.
Bociurkiw, Michael, "Product Guide: Vanessa Matz,", www.forbes,com/asap/2000/1127/vmartz_print.html, Nov. 27, 2000.
Compaq, "Personal Jukebox," Jan. 24, 2001, http://research.compaq.com/SRC/pjb/.
De Herrera, Chris, "Microsoft ActiveSync 3.1," Version 1.02, Oct. 13, 2000.
iAP Sports Lingo 0x09 Protocol V1.00, May 1, 2006.
IEEE 1394—Wikipedia, 1995, http://www.wikipedia.org/wiki/Firewire.
International Search Report dated Feb. 4, 2003 in corresponding application No. PCT/US2002/033330.
International Search Report dated Jul. 10, 2007 in corresponding application No. PCT/US2006/048738.
International Search Report dated Apr. 5, 2006 from corresponding International Application No. PCT/US2005/038819.
International Search Report dated Jul. 2, 2007 in related case PCT/US2006/048669.
International Search Report dated Jun. 19, 2007 in related Application PCT/US2006/048753.
International Search Report dated May 21, 2007 from corresponding PCT Application No. PCT/US2006/048670.

International Search Report in corresponding European Application No. 06256215.2 dated Feb. 20, 2007.
iTunes 2, Playlist Related Help Screens, iTunes v2.0, Apple Computer, Inc., Oct. 23, 2001.
iTunes, Playlist Related Help Screens, iTunes v1.0, Apple Computer, Inc., Jan. 2001.
Jabra Bluetooth Headset User Manual; GN Netcom A/s, 2005.
Jabra Bluetooth Introduction; GN Netcom A/S, Oct. 2004.
Jabra FreeSpeak BT200 User Manual; Jabra Corporation, 2002.
Kennedy, "Digital Data Storage Using Video Disc," IBM Technical Disclosure Bulletin, vol. 24, No. 2, Jul. 1981.
Miniman, "Applian Software's Replay Radio and Player v1.02," Product review, pocketnow.com, http://www.pocketnow.com/reviews/replay/replay.htm, Jul. 31, 2001.
Musicmatch, "Musicmatch and Xing Technology Introduce Musicmatch Jukebox," May 18, 1998, http://www.musicmatch.com/info/company/press/releases/?year=1998&release=2.
Nonhoff-Arps, et al., "Straßenmusik Portable MP3-Spieler mit USB-Anschluss," CT Magazin Fuer Computer Technik, Verlag Heinz Heise GMBH, Hannover DE, No. 25, Dec. 4, 2000.
Personal Jukebox (PJB), "Systems Research Center and PAAD," Compaq Computer Corp., Oct. 13, 2000, http://research.compaq.com/SRC/pjb/.
Sastry, Ravindra Wadali. "A Need for Speed: A New Speedometer for Runners", submitted to the Department of Electrical Engineering and Computer Science at the Massachusetts Institute of Technology, May 28, 1999.
Sinitsyn, Alexander. "A Synchronization Framework for Personal Mobile Servers," Pervasice Computing and Communications Workshops, 2004. Proceedings of the Second IEEE Annual Conference on, Piscataway, NJ, USA, IEEE, Mar. 14, 2004, pp. 208-212.
SoundJam MP Plus, Representative Screens, published by Casady & Greene, Inc., Salinas, CA, 2000.
Specification Sheet, iTunes 2, Apple Computer, Inc., Oct. 31, 2001.
Spiller, Karen. "Low-decibel earbuds keep noise at a reasonable level", The Telegraph Online, dated Aug. 13, 2006, http://www.nashuatelegraph.com/apps/pbcs.dll/article?Date=20060813&Cate... Downloaded Aug. 16, 2006.
Steinberg, "Sonicblue Rio Car," Product Review, Dec. 12, 2000, http://electronics.cnet.com/electronics/0-6342420-1304-4098389.html.
Travis Butler, "Archos Jukebox 6000 Challenges Nomad Jukebox," Aug. 13, 2001, http://db.tidbits.com/getbits.acgi?tbart=06521.
Travis Butler, "Portable MP3: The Nomad Jukebox," Jan. 8, 2001, http://db.tidbits.com/getbits.acgi?tbart=06261.
U.S. Appl. No. 11/621,541, "Personalized Podcasting Podmapping" filed Jan. 9, 2007.
Waterproof Music Player with FM Radio and Pedometer User Manual, Oregon Scientific, 2005.
Apple iTunes Smart Playlists, downloaded Apr. 5, 2005 from http://web.archive.org/web/20031002011316/www.apple.com/itunes/smartplaylists... pp. 1-2.
International Search Report dated Dec. 5, 2007 in PCT Application No. PCT/US2007/004810.
International Search Report in Patent Application No. PCT/US2006/048738 dated Jan. 29, 2008.
International Search Report in Patent Application No. PCT/US2007/077020 dated Jan. 28, 2008.
International Search Report in Patent Application No. PCT/US2007/076889 dated Jan. 28, 2008.
iTunes, Wikipedia, the free encyclopedia; downloaded on Oct. 5, 2005, pp. 1-6.
Nutzel et al., "Sharing Systems for Future HiFi Systems", The Computer Society, Jun. 2004.
Partial Search Report dated Sep. 6, 2007 in Patent Application No. PCT/US2007/004810.
Written Opinion dated Dec. 5, 2007 in Patent Application No. PCT/US2007/004810.
Written Opinion in Patent Application No. PCT/US2006/048738 dated Jan. 29, 2008.
Written Opinion in Patent Application No. PCT/US2007/076889 dated Jan. 28, 2008.

Written Opinion in Patent Application No. PCT/US2007/077020 dated Jan. 28, 2008.
Office Action dated Feb. 1, 2008 in U.S. Appl. No. 11/327,544.
Hart-Daves, Guy, "How to Do Everything with Your iPod and iPod Mini", 2004, McGraw-Hill Professional, p. 33.
Office Action dated Feb. 4, 2008 in U.S. Appl. No. 11/566,072.
"Creative liefert erstes Portable Media Center aus" [Online] Sep. 2, 2004, Retrieved from the internet on Sep. 20, 2007 from http://www.golem.de/0409/33347.html>.
International Search Report dated Feb. 18, 2008 in Patent Application No. PCT/US2007/079766.
International Search Report Dated Sep. 27, 2007 in Application No. 05824296.7.
Office Action dated Apr. 4, 2008 in U.S. Appl. No. 11/212,555.
Office Action dated Feb. 20, 2008 in Japanese Application No. 2007-538196.
Office Action dated Feb. 25, 2008 in U.S. Appl. No. 11/749,599.
Office Action dated Mar. 4, 2008 from U.S. Appl. No. 10/973,657.
Partial International Search Report dated Feb. 1, 2008 in Patent Application No. PCT/US2007/010630.
Written Opinion dated Feb. 18, 2008 in Patent Application No. PCT/US2007/079766.
Search Report dated Mar. 20, 2008 in Patent Application No. PCT/US2007/077789.
Written Opinion dated Mar. 20, 2008 in Patent Application No. PCT/US2007/077789.
Office Action dated Nov. 27, 2007 in Japanese Patent Application No. 2003-539048.
"Combination Belt Clip Leaf Spring and Housing Latch", Wandt et al.; Motorola Technical Developments, Motorola Inc. Schaumburg, IL. vol. 18, Mar. 1, 1993.
"Creative Zen Vision: M 30GB", Dec. 21, 2005; downloaded on Jan. 11, 2008 from http://web.archive.org/web/20051221050140/http://www.everthingusb.com/creative_zen_vision:m_30gb.html>.
International Search Report dated Jul. 7, 2008 in PCT Application No. PCT/US2007/076793.
International Search Report dated Jun. 10, 2008 in PCT Application No. PCT/US2007/010630.
Invitation to Pay Additional Fees and Partial Search Report for PCT Application No. PCT/US2007/077160 dated Apr. 1, 2008.
Kadir et al., "Adaptive Fast Playback-Based Video Skimming Using a Compressed-Domain Visual Complexity Measure", 2004 IEEE International Conference on Multimedia and Expo, pp. 2055-2058.
Office Action dated Jun. 17, 2008 in Patent Application No. 11/212,313.
Office Action dated May 30, 2008 in Chinese Patent Application No. 02825938.6.
Office Action dated Oct. 16, 2008 in U.S. Appl. No. 11/327,544.
Office Action in Japanese Patent Application No. 2008-045351 dated Aug. 5, 2008.
Office Action in U.S. Patent Application No. 11/212,555 dated Aug. 14, 2008.
Search Report dated May 15, 2008 in PCT Application No. PCT/US2007/019578.
Written Opinion dated Jul. 7, 2008 in PCT Application No. PCT/US2007/076793.
Written Opinion dated Jun. 10, 2008 in PCT Application No. PCT/US2007/010630.
Written Opinion dated May 15, 2008 in PCT Application No. PCT/US2007/019578.
Yee et al., "Faceted Metadata for Image Search and Browsing." Association for Computing Machinery, Conference Proceedings, Apr. 5, 2003.
Office Action in European Patent Application No. 05 855 368.6 dated Nov. 20, 2008.
Examination Report dated Sep. 1, 2009 in Singapore Application No. 200701865-8.
International Search Report dated Oct. 10, 2008 in PCT Application No. PCT/US2007/077160.
Notice of Allowance dated Apr. 21, 2009 in U.S. Appl. No. 11/327,544.
Notice of Allowance dated Dec. 18, 2008 in U.S. Appl. No. 11/212,555.

Notice of Allowance dated Feb. 4, 2010 in U.S. Appl. No. 11/535,646.
Notice of Allowance dated Jun. 15, 2009 in U.S. Appl. No. 11/212,313.
Office Action dated Apr. 12, 2010 in U.S. Appl. No. 12/397,051.
Office Action dated Apr. 13, 2010 in U.S. Appl. No. 12/406,793.
Office Action dated Apr. 15, 2010 in U.S. Appl. No. 11/373,468.
Office Action dated Apr. 9, 2009 in U.S. Appl. No. 11/583,199.
Office Action dated Dec. 11, 2009 in U.S. Appl. No. 11/519,352.
Office Action dated Dec. 14, 2009 in U.S. Appl. No. 11/535,646.
Office Action dated Dec. 15, 2008 in U.S. Appl. No. 11/212,313.
Office Action dated Dec. 16, 2009 in U.S. Appl. No. 11/746,548.
Office Action dated Feb. 3, 2010 in U.S. Appl. No. 11/439,613.
Office Action dated Jan. 26, 2009 in U.S. Appl. No. 11/373,468.
Office Action dated Jun. 2, 2009 in U.S. Appl. No. 11/530,773.
Office Action dated Jun. 22, 2009 in U.S. Appl. No. 11/515,270.
Office Action dated Jun. 24, 2009 in U.S. Appl. No. 11/373,468.
Office Action dated Jun. 24, 2009 in U.S. Appl. No. 11/519,352.
Office Action dated Mar. 10, 2010 in U.S. Appl. No. 11/583,327.
Office Action dated Mar. 24, 2010 in U.S. Appl. No. 11/583,199.
Office Action dated Mar. 25, 2010 in U.S. Appl. No. 11/297,032.
Office Action dated Mar. 30, 2009 in U.S. Appl. No. 11/515,270.
Office Action dated Mar. 4, 2010 in U.S. Appl. No. 11/324,863.
Office Action dated Mar. 9, 2010 in U.S. Appl. No. 11/519,352.
Office Action dated May 11, 2009 in U.S. Appl. No. 11/680,580.
Office Action dated May 27, 2009 in U.S. Appl. No. 11/439,613.
Office Action dated May 29, 2009 in EP Application No. 06 847 856.9.
Office Action dated Nov. 16, 2009 in U.S. Appl. No. 11/144,541.
Office Action dated Nov. 16, 2009 in U.S. Appl. No. 11/439,613.
Office Action dated Oct. 16, 2009 in U.S. Appl. No. 11/583,199.
Office Action dated Oct. 23, 2009 in Chinese Application No. 200580048143.9.
Office Action dated Sep. 1, 2008 in EP Application No. 06 256 215.2.
Office Action dated Sep. 10, 2009 in U.S. Appl. No. 11/746,548.
Office Action dated Sep. 2, 2009 in U.S. Appl. No. 11/515,270.
Office Action dated Sep. 25, 2009 in Chinese Application No. 200610130904.1.
Office Action dated Sep. 3, 2009 in U.S. Appl. No. 11/324,863.
Written Opinion dated Jan. 6, 2009 in Singapore Application No. 200701865-8.
Written Opinion dated Oct. 10, 2008 in PCT Application No. PCT/US2007/077160.
Office Action dated Jul. 12, 2010 in Japanese Application No. 2007-550394.
"A method of practical using a convenient handy tool. Aim at a master. Sony Network Walkman NW-E3," Mobile i, Japan, Softbank Publishing Corp., Oct. 1, 2000, vol. 6, No. 10, pp. 156-157.
Notice of Allowance dated Aug. 18, 2010 in U.S. Appl. No. 12/397,051.
Notice of Allowance dated Aug. 18, 2010 in U.S. Appl. No. 12/406,793.

* cited by examiner

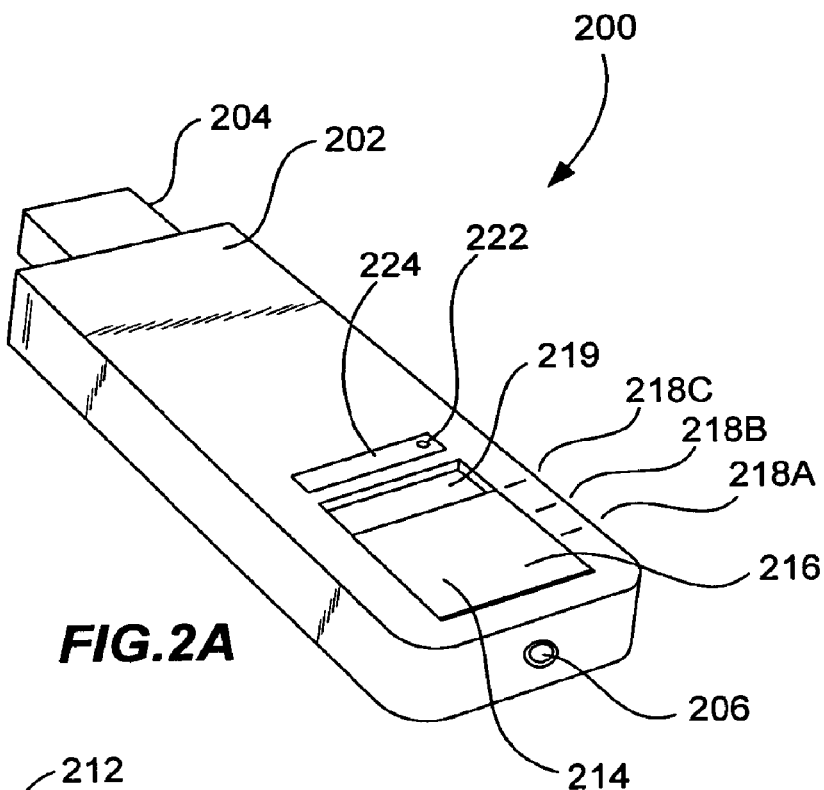
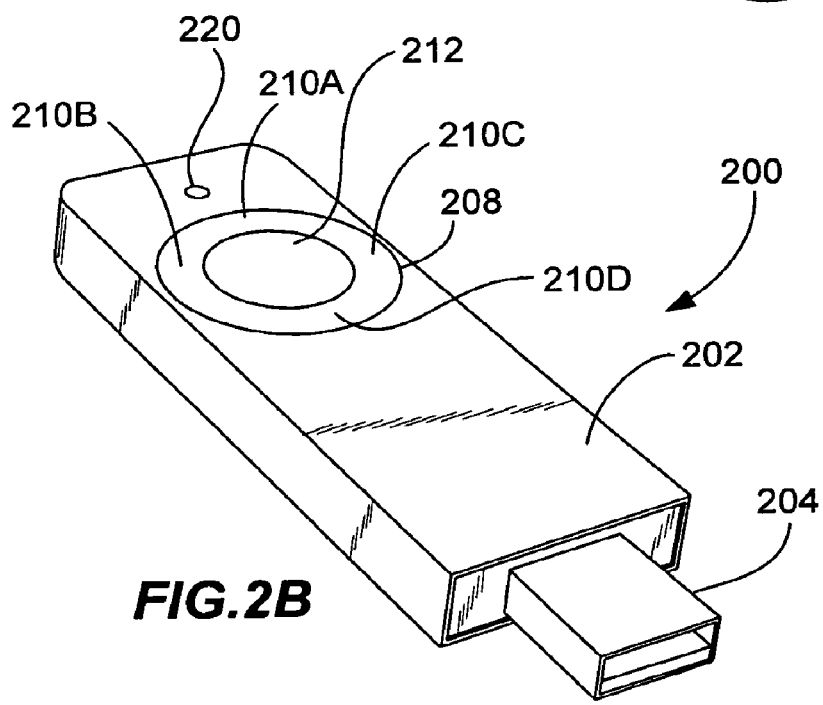

HIGHLY PORTABLE MEDIA DEVICE

CROSS-REFERENCE TO RELATED APPLICATIONS

This application is a continuation of U.S. patent application Ser. No. 11/212,313 filed Aug. 24, 2005 entitled "HIGHLY PORTABLE MEDIA DEVICE" by Jobs et al. that, in turn, claims priority to U.S. Provisional Patent Application No. 60/642,276, filed Jan. 7, 2005, and entitled "PORTABLE MEDIA DEVICE AND IMPROVED PLAYLIST PROCESSING ON MEDIA DEVICES", each of which are hereby incorporated herein by reference.

This application is also related to: (i) U.S. patent application Ser. No. 11/212,555, entitled "TECHNIQUES FOR IMPROVED PLAYLIST PROCESSING ON MEDIA DEVICES," which is hereby incorporated herein by reference; (ii) U.S. patent application Ser. No. 11/031,547, filed Jan. 7, 2005, entitled "PORTABLE POWER SOURCE TO PROVIDE POWER TO AN ELECTRONIC DEVICE VIA AN INTERFACE," which is hereby incorporated herein by reference; (iii) U.S. patent application Ser. No. 11/051,499, filed Feb. 3, 2005, entitled "ACCESSORY AUTHENTICATION FOR ELECTRONIC DEVICES," which is hereby incorporated herein by reference; (iv) U.S. patent application Ser. No. 11/031,288, filed Jan. 7, 2005, entitled "METHOD AND SYSTEM FOR DISCOVERING A POWER SOURCE ON A PERIPHERAL BUS," which is hereby incorporated herein by reference; (v) U.S. patent application Ser. No. 10/278,752, filed Oct. 22, 2002, entitled "METHODS AND APPARATUS FOR CHARGING A BATTERY IN A PERIPHERAL DEVICE," which is hereby incorporated herein by reference; and (vi) U.S. patent application Ser. No. 10/125,893, filed Mar. 18, 2002, entitled "POWER ADAPTERS FOR POWERING AND/OR CHARGING PERIPHERAL DEVICES," which is hereby incorporated herein by reference.

BACKGROUND OF THE INVENTION

1. Field of the Invention

The present invention relates to media devices and, more specifically, to portable media players that store and utilize digital media assets.

2. Description of the Related Art

Today, USB drives, also referred to as Flash drives or keychain drives, are popular portable data storage devices. A USB drive can be used in place of other storage mediums such as floppy disks, CDs, DVDs, zip drive disks, etc. In most cases, the USB drive is a plug and play device that includes Flash memory for storing data and a USB connector for connecting to a host device. While these devices work well, they are limited in the operations that they can perform. These devices are only configured for storing and transporting stored data (similar to other portable storage mediums) and therefore they do not include processing components, batteries for powering the processing components, or a user interface that enable users to communicate with the processing components.

Portable media players, also referred to as MP3 players, are also popular today. Portable media players can be grouped into three different categories: those with removable media storage, such as CD or DVD players; those with internal hard drives; and those that store media in non-volatile memory. Each category of portable media player has advantages and drawbacks in terms of size, functionality, battery life, and media storage capabilities.

Those portable media players that store media in non-volatile memory are commonly referred to as Flash MP3 players or Flash media players. Flash media players are often smaller than other types of portable media players. One problem common to many conventional Flash media players is that their small size often results in difficult-to-use media player controls. Although conventional Flash media players typically incorporate a display so that a user can navigate through the media files that are stored on the device, the display adds to the size, weight and power consumption. Even with a display, the media player controls are often not user friendly.

Another common problem with conventional Flash media players is bulky batteries, which are typically required to provide a reasonably long battery life before having to recharge the player or replace the player's batteries. Conventionally, media player designs have been made larger in order to accommodate improved user controls, batteries, and/or a display.

As portable media players have become more popular, there has been an increased demand for improved media player design. Thus, there remains a need for media players having improved user controls, small sizes, and longer battery life.

SUMMARY OF THE INVENTION

Broadly speaking, the invention relates to a media device and methods for operating a media device. The invention is particularly suitable for use with portable media players.

According to one aspect of the invention, a media device can also function as a solid-state drive for data storage. The solid-state drive can store not only media content for media items that can be played or otherwise presented by the portable media device but also data unrelated to media content.

In one embodiment, the form factor of the portable media device is hand-held or smaller. The portable media device may, for example, be small and lightweight enough to be carried in one hand, worn, or placed in a pocket. Although the form factor is generally small and hand-held (or palm-sized), the configuration of the device can vary widely. Some examples of configurations for the form factor are: an elongated stick, a memory stick, a memory drive (e.g., USB drive), etc. In one implementation, the portable media player has no display (display screen).

In another embodiment, the portable media device can use one or more status indicators. The indicators can be audio or visual. As an example, the status indicators can be implemented by dedicated light sources, such as light emitting diodes (LEDs). The indicators can provide visual feedback to a user.

In another embodiment, the portable media device can include a peripheral bus connector that enables the portable media device to removably and easily connect to a peripheral bus port operatively coupled to a host device, such as a personal computer. The portable media device can, therefore, communicate with the host device without using cables or other support devices, i.e., plugs directly into the host device. By way of example, the portable media device may share media files with the host device (or vice versa).

In another embodiment, the portable media device can include a battery and, more particularly, a rechargeable battery. In most cases, the battery serves to power components of the portable media device. In some cases, the battery can be recharged via a peripheral bus.

In yet another embodiment, the portable media device can include one or more input devices so that the portable media device can interact with a user. The input devices may, for example, include switches (e.g., slider switch, buttons, etc.) for controlling media operations or mode/state of the portable media device. In one particular implementation, a slider switch is used to select a media play mode.

According to another aspect of the invention, a portable media device has the capability to store media device status information in persistent memory before powering down. Thereafter, when the portable media device is again powered up, the stored media player status information can be retrieved and utilized.

According to still another aspect of the invention, a method allows a media device to form and/or traverse a media asset playlist in an efficient manner. The media asset playlist can, for example, pertain to a media asset continuous playlist or a media asset shuffle playlist.

The invention can be implemented in numerous ways, including as a method, system, device, apparatus, or computer readable medium. Several embodiments of the invention are discussed below.

As a portable media player, one embodiment of the invention includes at least: a non-volatile memory that stores a plurality of digital media assets and data files; a media player control interface that enables a user of the media player to select at least one of the media assets to be presented; and a controller operatively connected to the memory and the media player control interface. The controller operates in one of a media mode and a data mode. In the media mode, the controller operates to play the selected at least one media asset. In the data mode, the controller operates to store and retrieve data with respect to the memory.

As a portable electronic device in the form of an elongated stick that plugs into a peripheral port on a host computing device, one embodiment of the invention includes at least: a housing; a peripheral bus connector extending out an end of the housing and being configured for insertion into the peripheral port of the host computing device; a non-volatile electronic memory device disposed within the housing and configured to store data; and a media module disposed within the housing and configured to provide media operations on the portable electronic device, the media module cooperating with the non-volatile electronic memory device to retrieve media data therefrom, and the media module presenting the media data to a user of the portable electronic device. The portable electronic device is capable of operating as a removable storage device when connected to the host computing device, and is capable of operating as a media device when disconnected from the host computing device.

As a media player, one embodiment of the invention comprises: a non-volatile memory that stores a plurality of digital media assets; a multi-position switch configured to select a media play mode; a media player control interface that enables a user of the media player to select at least one of the media assets to be presented; and a controller operatively connected to the memory, the multi-position switch and the media player control interface. The controller operates to present the selected at least one media asset as well as to present a next media asset to be presented in accordance with the media play mode.

As a portable electronic device having a Flash memory drive for storing data and a USB connector for engaging a host device, one embodiment of the invention includes at least: a media module configured to provide media operations on the portable electronic device; an on-board battery for powering the media module; and an I/O system including a sliding switch for adjusting an operational mode of the media module. Additionally, the portable electronic device lacks a display and has a hand-held form factor.

As a portable electronic device having a plurality of operational modes, one embodiment of the invention includes at least: a memory device for storing data; a peripheral bus connector for directly connecting the portable electronic device to a port of a host device; and a sliding switch for selecting an operational mode of the portable electronic device from the plurality of operational modes of the portable electronic device.

As a portable electronic device, one embodiment of the invention includes at least: a USB connector for directly connecting the portable electronic device to a port of a host device; a media module configured to provide media operations on the portable electronic device; and an I/O system. Additionally, the portable electronic device lacks a display screen.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which:

FIGS. 2A and 2B are perspective diagrams of a portable media device according to one embodiment of the invention.

DETAILED DESCRIPTION OF THE INVENTION

In general, the invention relates to a media device and methods for operating a media device. The invention is particularly suitable for use with portable media players.

Embodiments of various aspects of the invention are discussed below with reference to FIGS. 1-16B. However, those skilled in the art will readily appreciate that the detailed description given herein with respect to these figures is for explanatory purposes as the invention extends beyond these limited embodiments.

According to one aspect of the invention, a media device can also function as a solid-state drive for data storage. The solid-state drive can store not only media content for media items that can be played or otherwise presented by the portable media device but also data unrelated to media content.

In one embodiment, the form factor of the portable media device is hand-held or smaller. The portable media device may, for example, be small and lightweight enough to be carried in one hand, worn, or placed in a pocket. Although the form factor is generally small and hand-held (or palm-sized), the configuration of the device can vary widely. Some examples of configurations for the form factor are: an elongated stick, a memory stick, a memory drive (e.g., USB drive), etc. In one implementation, the portable media player has no display (display screen).

In another embodiment, the portable media device can use one or more status indicators. The indicators can be audio or visual. As an example, the status indicators can be implemented by dedicated light sources, such as light emitting diodes (LEDs). The indicators can provide visual feedback to a user.

In another embodiment, the portable media device can include a peripheral bus connector that enables the portable media device to removably and easily connect to a peripheral bus port operatively coupled to a host device, such as a personal computer. The portable media device can, therefore, communicate with the host device without using cables or other support devices, i.e., plugs directly into the host device. By way of example, the portable media device may share media files with the host device (or vice versa).

In another embodiment, the portable media device can include a battery and, more particularly, a rechargeable battery. In most cases, the battery serves to power components of the portable media device. In some cases, the battery can be recharged via a peripheral bus.

In yet another embodiment, the portable media device can include one or more input devices so that the portable media device can interact with a user. The input devices may, for example, include switches (e.g., slider switch, buttons, etc.) for controlling media operations or mode/state of the portable media device. In one particular implementation, a slider switch is used to select a media play mode.

Figure 1:
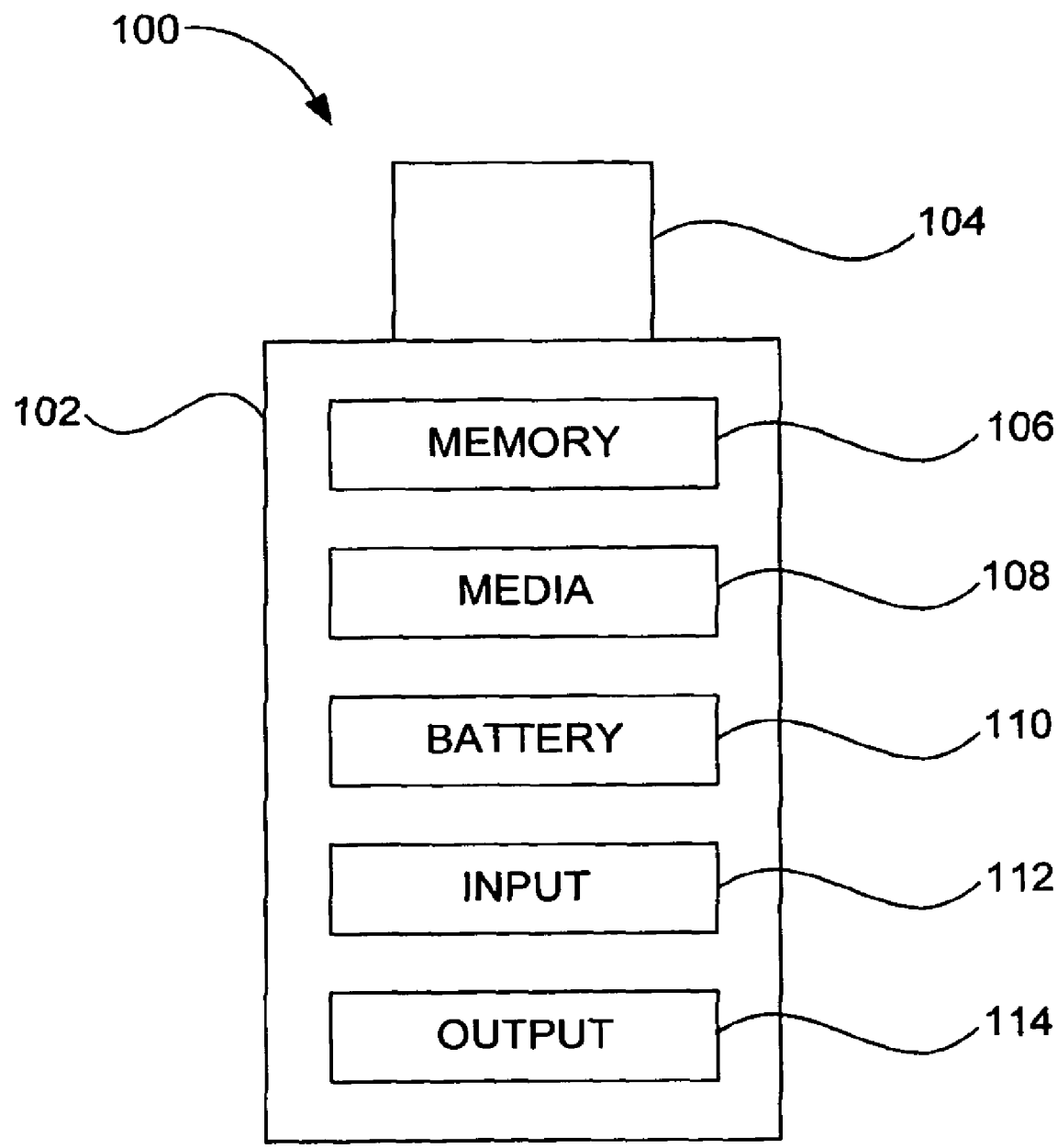
FIG. 1 is a diagram of a portable media device according to one embodiment of the invention.

FIG. 1 is a diagram of a portable media device 100 according to one embodiment of the invention. The media device 100 is a portable device including hardware for providing media and data capabilities. The portable media device 100 can couple to a host device such as a computer in order to transfer data between the media device 100 and the host device. In one embodiment, the media device 100 is plug and play device. The term plug and play (PnP) generally refers to functionality that gives users the ability to plug a device into a host device and have the host device recognize the device with little or no user input.

As shown in FIG. 1, the media device 100 includes a housing 102 that encloses internally the components of the media device 100. The media device 100 also includes an accessible connector 104 that extends out of the housing 102. The connector 104 is capable of plugging into a corresponding port on the host device in order to allow communications (e.g., data transfer) between the media device 100 and the host device. The connector 104 may be widely varied. In one embodiment, the connector 104 is a peripheral bus connector, such as a USB or FIREWIRE connector. These type of connectors include both power and data functionality, thereby allowing both power delivery and data communications to occur between the media device 100 and the host device when the media device 100 is connected to the host device. In some cases, the host device powers the media device 100.

The media device 100 also includes a memory device 106 for storing data. The data can be transferred back and forth between the media device 100 and the host device when the media device 100 is attached to the host device. The data may include media files (e.g., audio tracks), data files, and/or the like. The memory device 106 may be widely varied. In one particular embodiment, the memory device 106 is non-volatile memory, such as solid-state memory (e.g., Flash memory). Solid-state memory has many advantages over other types of memory devices. One advantage of the solid-state memory is that it tends to be very robust because there are no moving parts to break or skip (e.g., embodiment as an integrated circuit chip). Another advantage of solid-state memory is that the memory device tends to be small and lightweight and therefore lends itself to the portability of the media device 100.

In one embodiment, the media device 100 includes a media module 108 for controlling media operations on the media device. The media can, for example, be audio, video, images and/or the like. The media module 108 may, for example, be used to present (e.g., play) media on the media device 100. Hence, the media device 100 can be considered a media player. The media module 108 cooperates with the memory device 106 to store and retrieve media data. For example, the media module 108 may access the memory device 106 to obtain or deliver media data such as audio tracks (e.g., songs) and/or images (e.g., photos).

In one embodiment, the media device 100 includes an on-board battery 110 for providing power to the media device 100. The on-board battery 110 can, for example, power the media device 100 so that the media device 100 can be fully portable and operate when disconnected from any host device. The on-board battery 110 may be a fixed charged battery that needs to be replaced from time to time or the on-board battery may be a rechargeable battery. By way of example, the on-board battery 110 may be an alkaline battery, NiCad battery, Lithium Ion battery, or other type of battery. Rechargeable batteries are typically preferred over fixed charged batteries since they rarely have to be replaced (ease of use). In some cases, the rechargeable battery can be charged through the power functionality of the connector 104 when the connector 104 is operatively coupled to the port of a host device.

In one embodiment, the media device 100 includes one or more input devices 112. The input devices 112 are configured to transfer data from the outside world into the media device 100. The input devices 112 can, for example, be used to make selections or issue commands for the media device 100. By way of example, the input devices 112 may be selected from buttons, switches, keypads, wheels, joysticks, joy pads, touch screens, touch pads, track balls, and/or the like.

In one particular implementation, the input device 112 is embodied as a sliding switch that slides between various positions in order to change the state or mode of the media device 100. For example, in the case in which the media device 100 provides playing of audio tracks (e.g., music or songs), the sliding switch may include an off position, a shuffle play mode position, and a continuous play mode position. When the sliding switch is in the off position, the audio functionality of the media device 100 is turned off. When in the continuous play mode position, the media device 100 plays audio tracks in some predetermined order (e.g., alphabetically by composer or song title). When in the shuffle play mode position, the media device 100 randomly selects a group of audio tracks and then plays the audio tracks in the selected order.

In another implementation, the input device 112 is embodied as one or more clickable buttons that may be clicked in order to control some aspect of the media device 100. For example, in the case of the media device 100 that includes audio functionality, the clickable buttons may correspond to commands such as previous, next, volume up, volume down and play/pause.

In one embodiment, the media device 100 includes one or more output devices 114. The output devices 114 are configured to transfer data from the media device 100 to the outside world. The output devices 114 can, for example, be used to output audio or visual information to the user. The output devices 114 may be selected from speakers, audio jacks, indicators and/or the like.

Although conventional media devices mandate use of displays (display screens), such as liquid crystal displays (LCDs), for user interaction, the media device 100 advantageously need not include such a display. In one particular implementation, the media device 100 does not include a display, but includes (i) an audio jack for supplying audio output to a headset or external speakers and (ii) one or more indicators that provide user feedback and/or status of the media device. For example, the indicators may inform the user when a particular input device 112 has been actuated or may inform the user of status of battery life. By eliminating a display, the media device 100 can not only have a small form factor and be highly portable, but also reduce power consumption of the media device and therefore extend the life of the battery 110. As a result, the media device 100 can be used for longer periods of time without recharging or changing the on-board battery 110.

The position of the I/O devices 112 and 114 relative to the housing 102 may be widely varied. For example, the I/O devices 112 and 114 may be placed at any external surface of the housing 102 that is accessible to a user during manipulation of the media device 100 (e.g., top, side, front, or back).

In one implementation, the input devices 112 are generally positioned at locations that allow for one-handed operation of the input device 112, and more particularly at locations that allow manipulation with a single finger while holding the media device 100 with one hand. In one particular implementation, the input devices 112 are placed at an upper half of the housing 102. The input devices 112 can therefore be actuated by a thumb of a user's hand when the media device 100 is held by the fingers and palm of the user's hand. The output devices 114 are typically placed at locations that allow access thereto when the media device 100 is held in the user's hand. The output devices 114 may, for example, be placed above the input devices 112 so that they can be accessed when the user is manipulating the input devices 112. By orienting the I/O devices 112 and 114 in this manner, the media device 100 does not have to be constantly repositioned in order to effectively utilize the I/O devices 112 and 114. For example, undesirable repositioning may be necessary if buttons are placed in a row from the top to bottom of the device.

It should be noted that the various embodiments, implementations or features described above can be used separately or in combination. For example, the media device 100 including the connector 104 and the memory device 106 may only be configured with one of the embodiments described above (e.g., only an input device 112). Alternatively, the media device 100 including the connector 104 and the memory device 106 may be configured with two or more of the embodiments described above (e.g., an input device 112 and an output device 114). Alternatively, the media device 100 including the connector 104 and the memory device 106 may integrate all the embodiments described above. By way of example, the media device 100 may integrate the functionality of the accessible connector 104, the memory device 106, the media module 108, the battery 110 and the various I/O devices 112 and 114 into a single all-in-one unit, i.e., all the elements are contained within or positioned on the housing 102 of the media device 100. As a result, no support devices are needed (such as attachable battery packs or I/O devices) when operating the media device 100 away from a host device, i.e., the media device 100 is capable of both storing data as well as controlling, playing and outputting media when on the go. It should be emphasized that in this implementation, the connector 104 is accessible or exposed since its not plugged into any support devices. As such, the user can easily plug the connector 104 into a host device or other device (e.g., a dock, holder, battery pack, or lanyard). The media device 100 can also include a cover that removably attaches to and covers the connector 104.

Alternatively or additionally, the media device 100 may include imaging components for capturing and viewing images. In cases such as these, the media device 100 may act like a camera.

FIGS. 2A and 2B are perspective diagrams of a portable media device 200 according to one embodiment of the invention. The media device 200 can represent one implementation of the media device 100 illustrated in FIG. 1. The media device 200 is in the form of an elongated stick that can be easily held in one hand. The portable media device 200 combines the functionality of a media player with a memory device so that the portable media device 200 is capable of both presenting (e.g., playing) media (e.g., music) and storing various data files when on the go. The memory device can be used to store data files and media data (such as songs and playlists), and the media player can be used to play the media data stored in memory and in accordance with a playlist.

Typically, the media device 200 acts like a storage device (data can be transferred to and from the media device 200) when connected to a host device, and acts as a media player when removed from the host device (songs can be played). Alternatively or additionally, the media device 200 may act like a media player when connected to a host device (i.e., can be used to drive playing of music on the host device). It should be emphasized that all the components needed to support these devices when removed from the host device are contained within or positioned on the media device 200. No other support devices are needed to operate the components of the media device 200 (e.g., contains a battery and I/O devices).

As shown in FIGS. 2A and 2B, the portable media device 200 includes a housing 202 that defines the shape or form of the device 200. That is, the contour of the housing 202 may embody the outward physical appearance of the media device 200. The housing 202 also encloses and supports internally various electrical components of the media device 200 (including integrated circuit chips and other circuitry). By way of example, the electrical components may include a processor, memory, battery, I/O control circuitry and the like. In some cases, the electrical components are positioned on a substrate or carrier such as a Printed Circuit Board (PCB). The substrate or carrier provides a structure for carrying the electrical components during assembly and supporting them when assembled inside the housing 202. By way of example, the media device 200 including the housing and internal components may be assembled similarly to the invention disclosed in U.S. patent application Ser. No. 10/884,172, filed Jul. 2, 2004 and entitled "HANDHELD COMPUTING DEVICE," which is herein incorporated by reference.

The media device 200 also includes a peripheral bus connector 204 that extends out a bottom end of the housing 202. The peripheral bus connector 204 is configured for insertion into a port so that data may be transferred between the media device 200 and a host device (see FIG. 3). The peripheral bus connector 204 may be used to upload or download media, or other data to and from the media device 200. For example, the peripheral bus connector 204 may be used to download songs, playlists, audio books, ebooks, and the like into a memory device within the media device 200. The peripheral bus connector 204 may also serve as the interface for powering and charging the media device 200. In some cases, a cover or cap may be provided to cover and protect the connector 204 and to provide a smooth continuous surface (uniform appearance) with the rest of the housing 202. The peripheral bus connector 204 may, for example, correspond to a USB connector.

Figure 3:
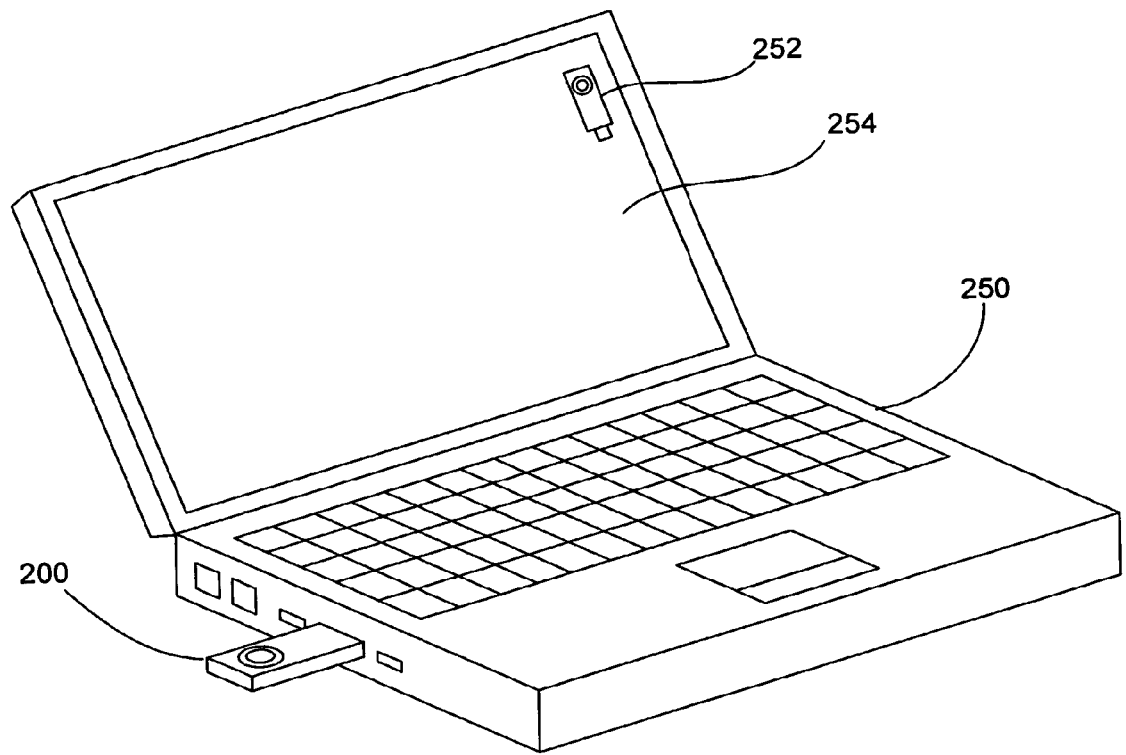
FIG. 3 shows the media device plugged into a port located on a laptop computer.
Figure 4:
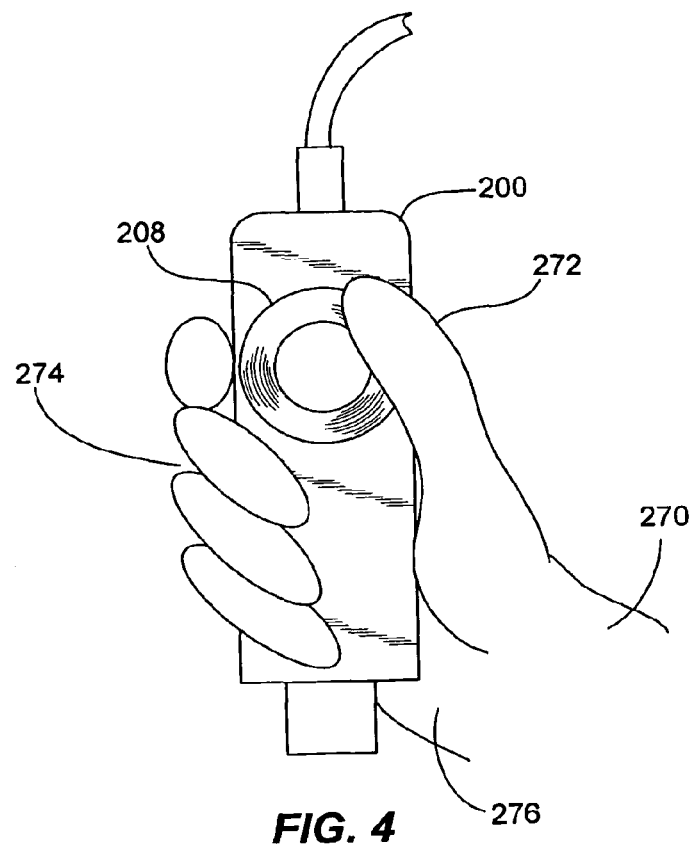
FIGS. 4 and 5 illustrate a media device seated within a user's hand.
Figure 5:
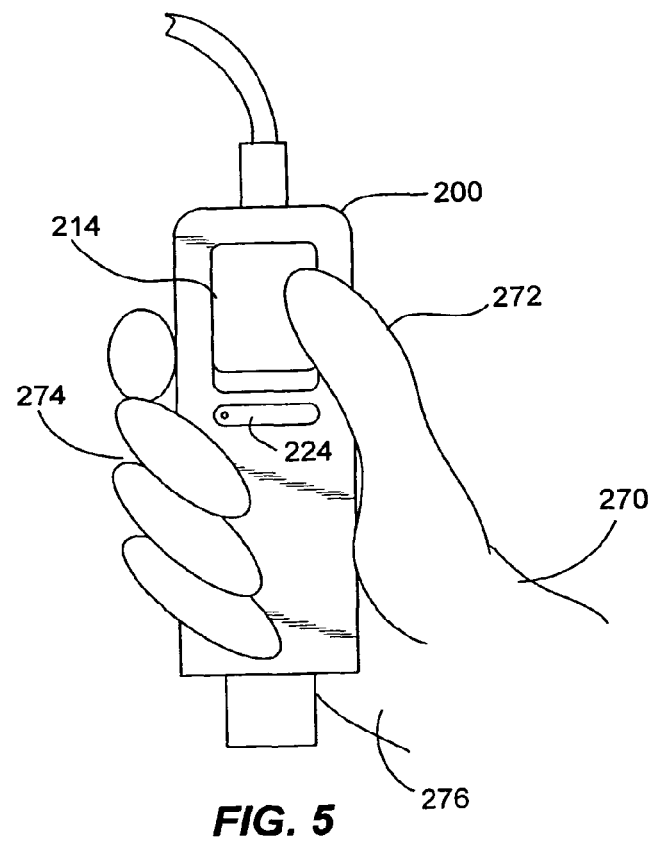

As shown, the cross-section of the housing 202 is typically slightly larger than the cross-section of the connector 204, and the length of the housing 202 is typically configured so that the media device 200 can be easily held in a user's hand while providing enough storage for the internal components (see FIGS. 4 and 5). By keeping the cross-section to a minimum, the media device 200 tends not to interfere with other connectors when they are connected to the host device along with the media device 200. As should be appreciated, many ports are closely stacked or laid out in a line on the side or back of the host device (see FIG. 3). Furthermore, smaller sizes typically mean that the media device 200 can be placed in a pocket, around the user's neck or on a key chain, making for easy transportability. By way of example, and not by way of limitation, the housing 202 may have a thickness of about 9 mm, a width of about 25 mm, and a length of about 85 mm.

The media device 200 also includes an audio jack 206 that allows audio information to be output from the media device 200. The audio jack 206 can, for example, receive an audio plug connected to a speaker or a headset (e.g., earphones).

The media device 200 also includes a clickable button actuator 208 located on one side of the housing 202 and a sliding modal switch 214 located on an opposite side of the housing 202. Each of these input devices 208 and 214 allows a user to interact with the media device 200, i.e., provide user inputs. The clickable button actuator 208 provides playback controls for the media player aspect of the media device 200, while the sliding modal switch 214 provides a means for switching between various modes of the media player. More generally, the clickable button actuator 208 is a control input device.

To elaborate, the clickable button actuator 208 is located in a top region on the front side of the housing 202. The clickable button actuator 208 includes a plurality of peripheral buttons 210 that surround a center button 212. In one particular embodiment, the clickable button actuator 208 has a circular arrangement. In the case of a media player, the peripheral buttons 210 may correspond to previous, next, volume up and volume down, and the center button 212 may correspond to play/pause. Moreover, press and hold of the center button 212 can correspond to shuffle. The peripheral buttons 210 may be separate devices that each provide their own clicking action or they may be integrated into a single device that provides a plurality of clicking actions. If the latter, the single device can be divided into a plurality of independent and spatially distinct button zones. The button zones represent regions of the single device that may be tilted or depressed relative to the housing 202 in order to implement a distinct clicking action.

Although not shown, in one embodiment, the clicking actions are arranged to actuate one or more movement indicators contained inside the housing 202. That is, a particular button or button zone 210, 212 moving from a first position (e.g., upright) to a second position (e.g., depressed) is caused to actuate a movement indicator. The movement indicators are configured to detect movements (e.g., a clicking action) and to send signals corresponding to the movements to a controller of the media device 200. By way of example, the movement indicators may be switches, sensors and/or the like. In most cases, there is a movement indicator for each button or button zone 210, 212.

As shown in FIG. 2A, the sliding modal switch 214 is located in a top region on the backside of the housing 202. The sliding modal switch 214 includes a moving member 216 capable of translating between three positions in order to adjust the state or mode of the media device 200. In the illustrated embodiment, the moving member 216 moves between a top position 218A, which turns off the media player, a middle position 218B, which sets the media player in a shuffle mode, and a bottom position 218C, which sets the media player in a continuous play mode. As illustrated in FIG. 2A, the moving member 216 can, for example, be flush with the housing 202. In most cases, the moving member 216 is slideably retained within a recess 219 on the back surface of the housing 202. In one example, the moving member 216 may include tabs on each of its sides that are trapped inside a channel at the sides of the recess 219. In another example, the moving member 216 may include a channel that receives tabs at the sides of the recess 219. In yet another example, the moving member 216 may include a flange on its bottom surface that slides in a channel located in the bottom surface of the recess 219. In all of these cases, the moving member 216 is configured to actuate one or more movement indicators. The movement indicators are configured to detect movements of the moving member 216 during the sliding action and to send signals corresponding to the movements to a controller of the media device 200. In some cases, detents may be provided at each position in order to inform a user when the moving member 216 is located at each of the positions. The detents, or other means, may provide force feedback and/or auditory signals, such as clicking sounds, to its user.

In one embodiment, the input device 208 and 214 for the media device 200 are provided only on a front or back surface of the housing 202 for the media device 200. In such an embodiment, there are no input devices on the sides of the media device 200. Advantageously, accidental inputs can reduced and the sides of the media device 200 can be used to grip and hold the media device 200.

The media device 200 does not include a display, but does however include one or more indicators that indicate events associated with the media device 200. By way of example, the events may relate to signals, conditions or status of the media device 200. In one embodiment, the indicators, which can include light sources such as light emitting diodes (LED), are typically normally not illuminated but are illuminated for a limited duration when an event occurs. Furthermore, the indicator may turn on and off (e.g., blink) or cycle with increasing or decreasing intensity, and in some cases may even change colors in order to provide more detailed information about the event that is being monitored. In general, the indicators can also be referred to as status indicators or media device status indicators.

The indicators may be conventional indicators that typically include a small clear plastic insert, which is located in front of the LED, and which is inserted within an opening in the housing thus causing it to exist at the surface of the housing. The LED itself may also be placed in the opening in the housing rather than using an insert. Alternatively, the indicator can be configured not to break the surface of the housing. In this configuration, the light source is disposed entirely inside the housing. The indicator can be configured to illuminate a portion of the housing thereby causing the housing to change its appearance, i.e., change its color. By way of example, a change in color may indicate a change in status of the media device 200. During operation, an indicator light appears on the surface of the housing 202 when the indicator is on, and it disappears from the surface of the housing 202 when the indicator is off. One advantage of this type of indicator is that there is no trace of the indicator when the indicator is off. In other words, the indicator can be perceived only when the indication (e.g., indicator light) is turned on. Furthermore, the indicator avoids substantial breaks, lines, pits or protrusions in the surface of the housing 202, which are aesthetically unpleasing and degrade the look of the media device 200. Example of indicators of this type are disclosed in greater detail in U.S. patent application Ser. No. 10/773,897, filed Feb. 6, 2004 and entitled "ACTIVE ENCLOSURE FOR COMPUTING DEVICE," which is herein incorporated by reference.

In the illustrated embodiment, the media device 200 includes a condition or control indicator 220 and a status indicator 222. The control indicator 220 is located on the front side of the housing 202 above the clickable button actuator 208. The control indicator 220 is configured to alert or inform a user when a selection has been made via the input device 208. That is, the control indicator 220 provides user feedback so that the user knows that a selection has been successfully made. Because the control indicator 220 is positioned above the input device 208, the control indicator can always be seen by the user even when selections are being made via the input device 208 (see FIG. 4). In this particular embodiment, the control indicator 220 is a hidden indicator that illuminates a small portion of the housing 202 about the control indicator 220 rather than protruding through the surface of the housing 202.

The status indicator 222, on the other hand, is located on the back side of the housing 202 below the modal input device 214. The status indicator 222 is configured to alert the user to a particular status, particularly the life of the battery of the media device 200. The status indicator 222 can, for example, be illuminated green when the battery is fully charged, yellow when the battery is low, and red when the battery is dangerously low. The status indicator 222 can also flash on and off (blink) when the battery is critically low. The status indicator 222 may be an always-on indicator that always presents status information, or it may be an on-call indicator that only presents status information when prompted by the user. In the latter case (which is shown in FIG. 2A), a button 224 may be provided to activate the status indicator 222. When the user presses the button 224, the status indicator 222 presents the status information for some predetermined amount of time (e.g., a few seconds).

FIG. 3 shows the media device 200 plugged into a port located on a laptop computer 250. When connected, the laptop computer 250 can supply power to the media device 200 in order to power the media device 200 as well as to possibly charge its battery. Because the media device 200 is typically a plug and play device, the laptop computer 250 recognizes the media device 200 as a media device and in some cases generates a media device icon 252 on the display 254 of the laptop computer 250. Selecting the media device icon 252 typically opens a window that shows the data and media files stored in the memory of the media device 200. The data and media files stored on the media device 200 can be transferred to the laptop computer 250 using a drag and drop function. In addition, new data and media files stored on the laptop computer 250 may be added to the memory of the media device 200 using a drag and drop function. In some cases, some or a portion of the media files stored in the laptop computer 250 are automatically synchronized with the media device 200. That is, once the laptop computer 250 recognizes the media device 200 and determines that the media device 200 includes media functionality, the laptop computer 250 can be configured to automatically deliver all or a select few of the media files (e.g., audio tracks) stored in the laptop computer 250 to the memory of the media device 200. The laptop computer 250 can also launch a media management application when the media device 200 is recognized. One example of a music management program is iTunes® manufactured by Apple Computer, Inc. of Cupertino, Calif.

Referring to FIGS. 4 and 5, the media device 200 is comfortably seated within a user's hand 270 (and removed from any host device). As shown in FIG. 4, the control input device 208 can be easily manipulated by the thumb 272 of the hand 270 while the fingers 274 and palm 276 of the hand 270 holds the media device 200. By way of example, the user may move their thumb 272 over any of the various buttons of the control input device 208 without repositioning their hand 270, and more particularly their fingers 274. As shown in FIG. 5, the modal switch 214 as well as the status button 224 can be easily manipulated by the thumb 272 of the hand 270 while the rest of the hand holds the media device 200. By way of example, the user may use their thumb 272 to move the sliding modal switch 214 to any of its various positions as well as to select the status button 224.

Figure 6:
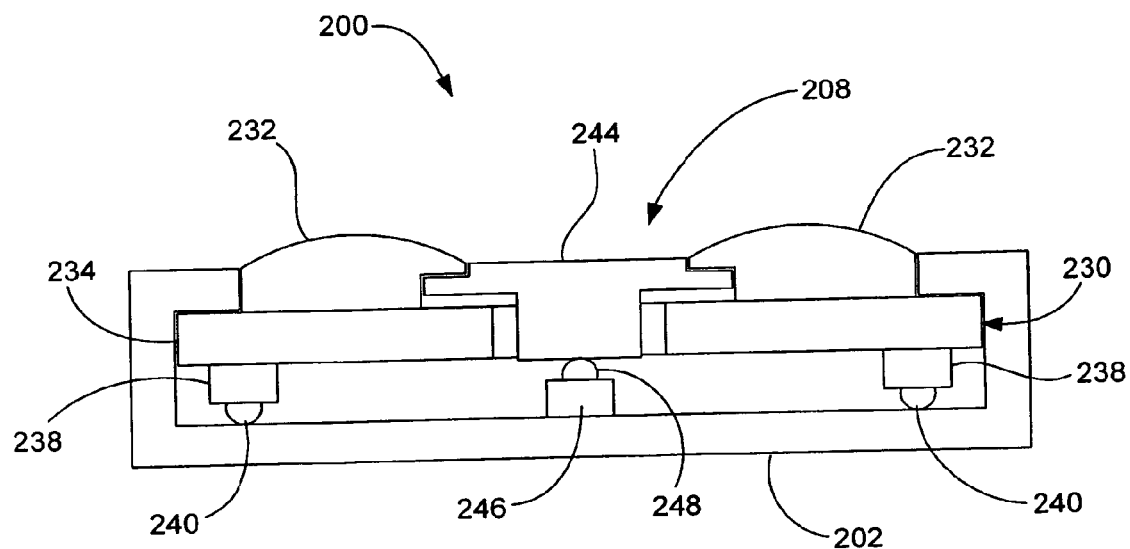
FIG. 6 is a diagram of a control input device according to one embodiment.

Referring to FIG. 6, the control input device 208 according to one embodiment will be described in greater detail. As shown, the control input device 208 includes a movable platform 230 that tilts relative to the housing 202. In some cases, the platform 230 is movably coupled to the housing 202 and in other cases the housing 202 movably restrains a floating platform 230 (as shown). The platform 230 generally includes a cosmetic or tactile layer 232 that is attached to the top surface of a rigid plate 234. The cosmetic layer 232 protrudes though an opening 236 in the housing 202, and provides a tactile surface for actuating the various peripheral buttons of the control input device 208. In the illustrated embodiment, the cosmetic layer 232 includes a rounded top surface.

The control input device 208 further includes one or more mechanical switches 238 disposed between the platform 230 and the housing 202 in order to generate input signals based on movements of the platform 230. The mechanical switches 238 are typically placed in locations that correspond to the various button zones. Each of the button zones includes a distinct mechanical switch 238 located underneath the button zone. The mechanical switches 238 include actuators 240 that cause input signals to be generated when depressed. Tilting the platform 230 in the region of the mechanical switch 238 compresses the actuator 240, thereby causing an input signal to be generated. In most cases, the actuators 240 are spring biased so that they extend away from the mechanical switch 238 and bias the platform 230 in the upright position. The mechanical switches 238 may be attached to the housing 202 or to the platform 230. In the illustrated embodiment, the mechanical switches 238 are attached to the backside of the platform 230. As such, the mechanical switches 238 and more particularly the actuators 240 act as legs for supporting the platform 230 in its upright position within the housing 202 (i.e., the actuators rest on the housing or some component mounted to the housing). By way of example, the mechanical switches 238 may correspond to tact switches, such as dome switches packaged for SMT.

As mentioned above, the platform 230 is movably restrained within a cavity 242 provided in the housing 202. In essence, the platform 230 floats in space relative to the housing 202 while still being constrained thereto (the platform is not attached to the housing). As shown, the platform 230 is surrounded by side walls, a top wall and bottom wall of the housing 202. The side walls are configured to substantially prevent movements in the x and y directions as well as rotations about the z axis (e.g., excluding a small gap that allows a slight amount of play in order to prevent the platform 230 from binding with the housing during the tilting action). The top and bottom walls, however, are configured to allow movement (although limited) in the z direction as well as rotation about the x and y axis in order to provide the tilting action. That is, while the top and bottom walls and may constrain the platform 230 to the cavity 242, they also provide enough room for the platform 230 to tilt in order to depress the actuator 240 of the mechanical switches 238. Furthermore, the spring force provided by the mechanical switches 238 places the top surface of the platform 230 into mating engagement with the bottom surface of the top wall of the housing 202 (e.g., upright position).

During operation, a user simply presses on the top surface of the platform 230 in the location of the desired button zone in order to activate the mechanical switches 238 disposed underneath the platform 230 in the location of the button zones. When activated, the mechanical switches 238 generate input signals that may be used by the media device 200. To activate the mechanical switch 238, a force provided by a finger works against the spring force of the actuator 240 until the mechanical switch 238 is activated. Although the platform 230 essentially floats within the cavity of the housing 202, when the user presses on the desired button zone over one side of the platform 230, the opposite side contacts the top wall (opposite the press) thus causing the platform 230 to pivot about the contact point. In essence, the platform pivots about four different axes.

Furthermore, a button cap 244 is disposed between the cosmetic layer 232 and the top side of the rigid plate 234. A top portion of the button cap 244 is configured to protrude through an opening in the cosmetic layer 232 while a flange portion is retained in a space formed between the cosmetic layer 232 and the rigid plate 234. The top portion of the button cap 244 may be pushed to activate a fifth switch 246 located underneath the button cap 244. The fifth switch 246 may be attached to the housing 202 and pass through openings in the rigid plate 234 and cosmetic layer 232. When assembled, the actuator 248 of the fifth switch 246 forces the button cap 244 into an upright position via a spring element similar to the other switches 238.

It should be noted that the particular implementation described in FIG. 6 is not a limitation and that the control input device 208 can be configured in a variety of different ways. U.S. patent application Ser. No. 10/643,256, filed Aug. 18, 2003 and entitled "MOVABLE TOUCHPAD WITH ADDED FUNCTIONALITY," describes several embodiments of control input devices that may be used, including control input devices with touch sensitive components, and is hereby incorporated herein by reference.

Figure 7:
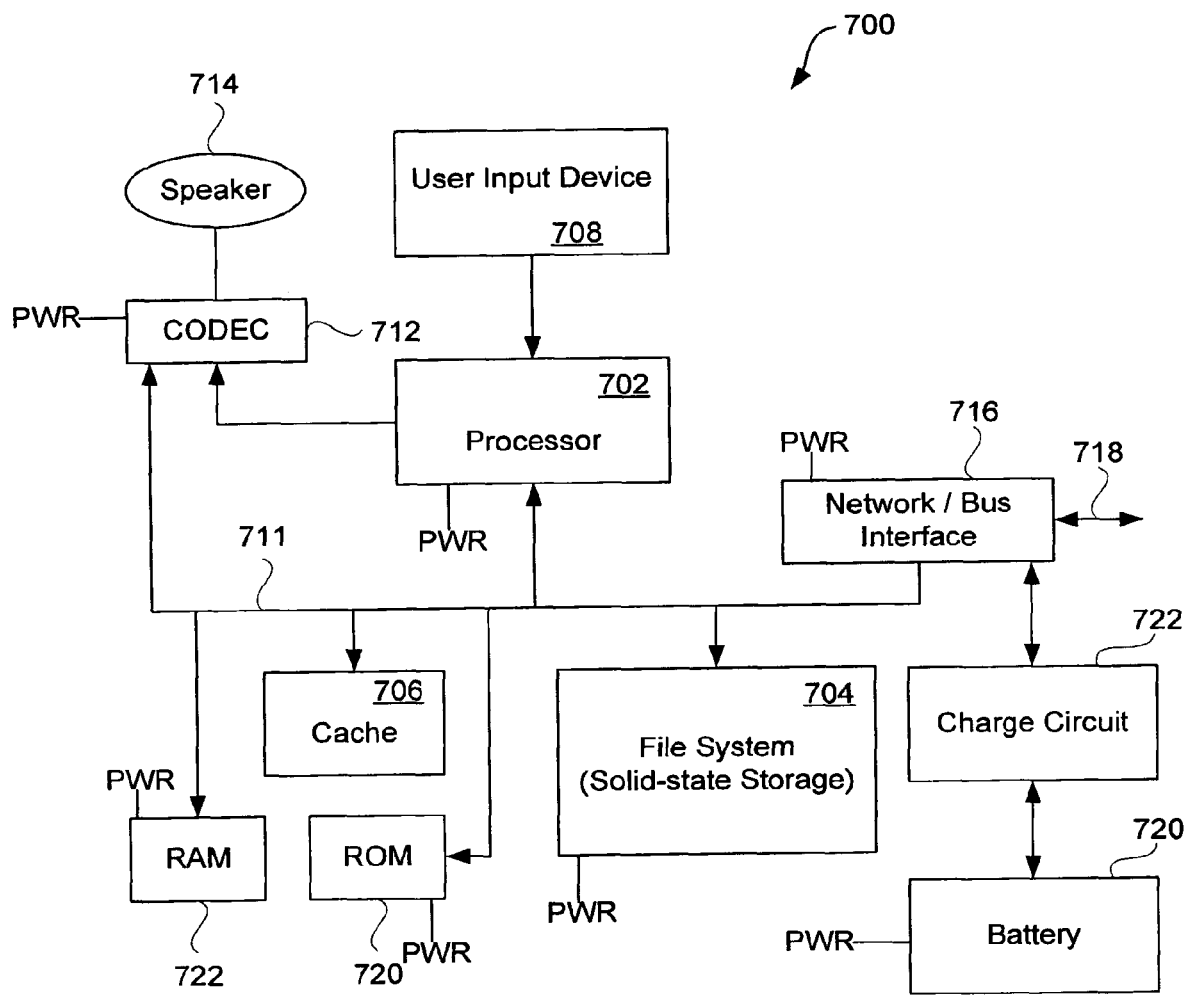
FIG. 7 is a block diagram of a media device according to one embodiment of the invention.

FIG. 7 is a block diagram of a media device 700 according to one embodiment of the invention. The media device 700 includes a processor 702 that pertains to a microprocessor or controller for controlling the overall operation of the media device 700. The media device 700 stores media data pertaining to media items in a file system 704 and a cache 706. The file system 704 is, typically, a solid-state storage medium. As an example, the solid-state storage medium can be FLASH memory. The file system 704 typically provides high capacity storage capability for the media device 700. The file system 704 can store not only media data but also non-media data. When the media device 700 operates in a media play mode, the file system 704 can store and retrieve media files. In the media play mode, the media device 700 can be considered a media player. Alternatively, when the media device 700 operates in a data mode, the file system 704 can store and retrieve data files. In the data mode, the media device 700 can be referred to as a FLASH drive or USB drive. However, since the access time to the file system 704 is relatively slow, the media device 700 can also include a cache 706. The cache 706 is, for example, Random-Access Memory (RAM) provided by semiconductor memory. The relative access time to the cache 706 is substantially shorter than for the file system 704. However, the cache 706 does not have the large storage capacity of the file system 704. Further, the file system 704, when active, consumes more power than does the cache 706. The power consumption is often a concern when the media device 700 is a portable media player that is powered by a battery (not shown). The media device 700 also includes a RAM 720 and a Read-Only Memory (ROM) 722. The ROM 722 can store programs, utilities or processes to be executed in a non-volatile manner. The RAM 720 provides volatile data storage, such as for the cache 706.

The media device 700 also includes one or more user input devices 708 that allow a user of the media device 700 to interact with the media device 700. For example, the user input devices 708 can take a variety of forms, such as buttons, keypads, dials, switches, etc. A data bus 711 can facilitate data transfer between at least the file system 704, the cache 706, the processor 702, and the CODEC 712.

In one embodiment, the media device 700 serves to store a plurality of media assets (e.g., songs, photos, etc.) in the file system 704. When a user desires to have the media device 700 play a particular media asset, the user operates the user input device 708 to select a media player mode. Then, using the user input device 708, the user can play the next available media asset. The processor 702, upon receiving a selection of a particular media item, supplies the media data (e.g., audio file) for the particular media item to a coder/decoder (CODEC) 712. The CODEC 712 then produces analog output signals for a speaker 714. The speaker 714 can be a speaker internal to the media device 700 or external to the media device 700. For example, headphones or earphones that connect to the media device 700 would be considered an external speaker.

Additionally, the media player may be set to a specific media play mode, according to some embodiments of the invention. The mode selection is typically made using the user input device 708, such as a switch or button. Two typical media play modes are a continuous play mode and a shuffle play mode. Generally, in the shuffle play mode, the media player plays through a list of media assets in a random order, while in the continuous play mode, the media player plays through the list of media assets according to a default order.

The default order for the list of media assets can, for example, be (i) alphabetically ordered by song name, (ii) ordered by track position on an album, or (iii) ordered by date loaded onto the media player. In one embodiment of the invention, the media play mode is selected using a three-position switch, which allows a user of the media player to select between off, continuous play mode, and shuffle play mode.

The media device 700 also includes a network/bus interface 716 that couples to a data link 718. The data link 718 allows the media device 700 to couple to a host computer. The data link 718 can be provided over a wired connection or a wireless connection. In the case of a wireless connection, the network/bus interface 716 can include a wireless transceiver. In one embodiment, the media device 700 can include a peripheral bus connector coupled to the network/bus interface. Examples of a peripheral bus connector are a USB connector or a FireWire® connector.

It should be noted that FIG. 7 does not indicate that the media device 700 includes a display (display screen). Although a conventional media player requires a display to enable a user to interface with the media player, the media device 700 shown in FIG. 7 does not include a display. By not providing a display, the media player is able to be smaller and lighter than conventional media players. A battery 720 that powers the various components of the media device 700 (at least when not attached to a host computer (or peripheral bus)) is also able to be smaller since power consumption is reduced. The battery 720 can be rechargeable and charged by a charge circuit 722 using power available from the peripheral bus.

In one embodiment, to facilitate user interaction with the media device 700 (which lacks a display), the user input device 708 can include at least a shuffle switch. The shuffle switch enables a user to shuffle the media assets (e.g., songs) being played by the media device 700. The user input device 708 can also include a control input device that allows a user to signal a request to play, pause, next forward, next back, disable control inputs temporarily, and reshuffle the media assets.

Figure 8:
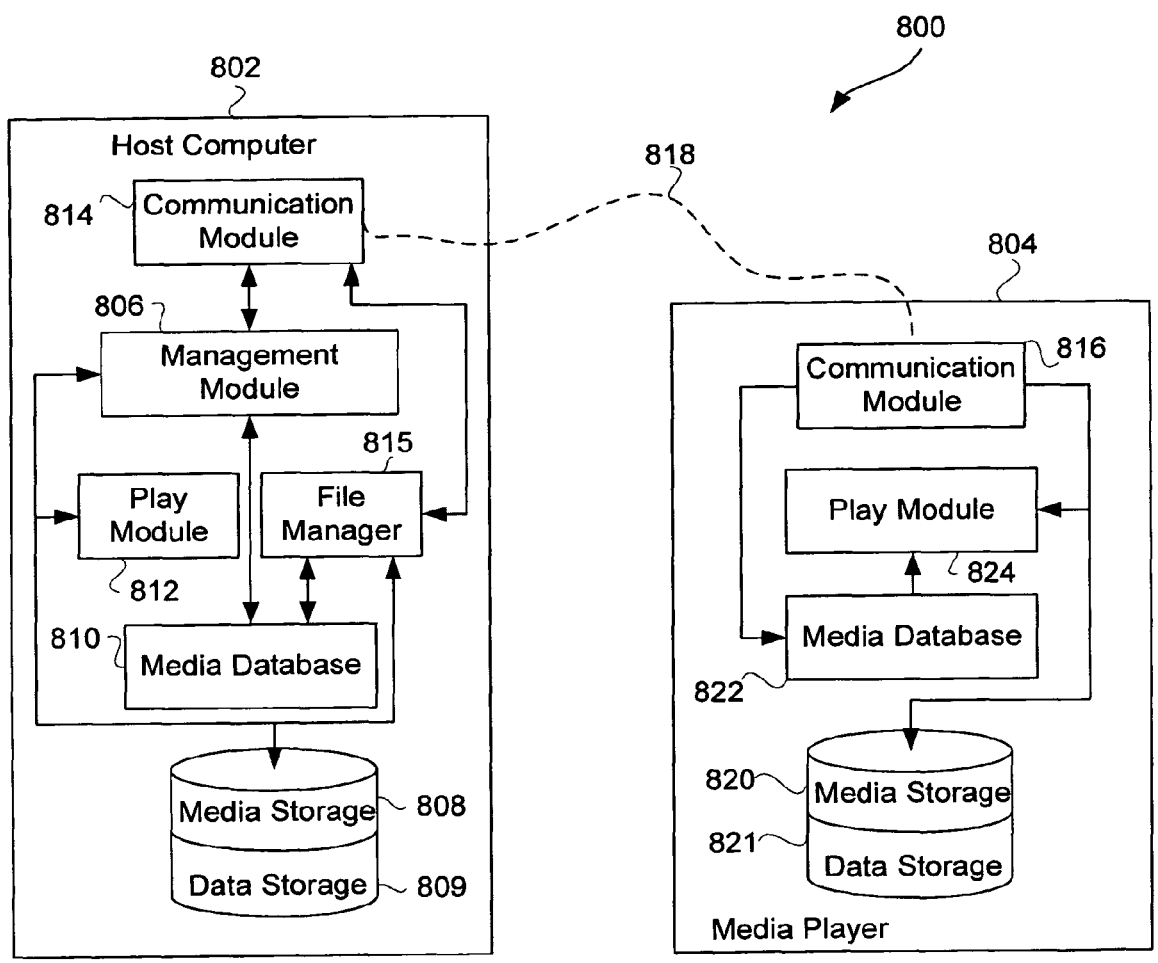
FIG. 8 is a block diagram of a media management system according to one embodiment of the invention.

FIG. 8 is a block diagram of a media management system 800 according to one embodiment of the invention. The media management system 800 includes a host computer 802 and a media player 804. The media player can be, for example, the media player 700 of FIG. 7. The host computer 802 is typically a personal computer. The host computer, among other conventional components, includes a management module 806, which is a software module. The management module 806 provides for centralized management of media assets (and/or playlists) not only on the host computer 802 but also on the media player 804. More particularly, the management module 806 manages those media assets stored in media storage 808 associated with the host computer 802. The management module 806 also interacts with a media database 810 to store media information associated with the media assets stored in media storage 808. Some embodiments also include a file manager 815, which provides for management of other data files (i.e., non-media asset files) on both the host computer 802 and the media player 804.

The media information pertains to characteristics or attributes of the media assets. For example, in the case of audio or audiovisual media, the media information can include one or more of: title, album, track, artist, composer and genre. These types of media information are specific to particular media assets. In addition, the media information can pertain to quality characteristics of the media assets. Examples of quality characteristics of media assets can include one or more of: bit rate, sample rate, equalizer setting, volume adjustment, start/stop and total time.

Further, in some embodiments, the management module 806 also interacts with the host computer 802 to transfer data files (i.e., non-media asset files stored on the host computer 802, typically on the host computer's hard drive) to and from media storage 808. Alternately, in some embodiments, data files may be transferred to and from optional data storage 809, which may be physically and/or logically combined with or separate from media storage 808. It is understood that a data file includes any data that is capable of being stored in a file system, which includes all file types. Typical data files include text documents, executable files, and graphics files. Alternately, in some embodiments, the management module 806 does not directly access data files. Rather, the user transfers files back and forth to/from or deletes files from the media player 804 using the file manager 815, on the host computer, where the media player appears, for example, as a disk drive or removable storage medium.

The data storage 809 and/or the media storage 808 can utilize one or more directories (e.g., folders) in the host computer's file system (e.g., on a hard drive, not shown). As is conventional, data stored on the data storage 809 can be assessed by a file manager 815. In addition, in one embodiment, media assets stored in the media storage 808 can also be accessed by the file manager 815. The file manager 815 can be, for example, a file explorer, such as a "Finder" application which is part of Apple Computer's operating system.

Still further, the host computer 802 includes a play module 812. The play module 812 is a software module that can be utilized to play certain media assets stored in media storage 808. In some embodiments, the play module 812 can also be used to play media assets stored outside of media storage 808, such as media assets stored in data storage 820 on the media player 804.

The host computer 802 also includes a communication module 814 that couples to a corresponding communication module 816 within the media player 804. A connection or link 818 removeably couples the communication modules 814 and 816. In one embodiment, the connection or link 818 is a cable that provides a data bus, such as a FIREWIRE® bus or USB bus, which is well known in the art. In another embodiment, the connection or link 818 is a wireless channel or connection through a wireless network. In still another embodiment, the connection or link 818 is a USB connection established by direct coupling of a USB connector on the media player 804 to a USB slot on the host computer 802. In this embodiment, the media player 804 is directly inserted into a USB slot on the host computer 802 without using a cable. Hence, depending on implementation, the communication modules 814 and 816 may communicate in a wired or wireless manner.

The media player 804 also includes media storage 820 that stores media assets within the media player 804. Optionally, media storage 820 can also store data files in data storage 821. The media assets or data files being stored to media asset storage 820 or data storage 821 are typically received over the connection or link 818 from the host computer 802. More particularly, the management module 806 sends all or certain of those media assets or data files residing in media storage 808 or file storage 809 over the connection or link 818 to media storage 820 or file storage 821 within the media player 804. Additionally, the corresponding media information for the media assets that is also delivered to the media player 804 from the host computer 802 can be stored in a media database 822. In this regard, certain media information from the media database 810 within the host computer 802 can be sent to the media database 822 within the media player 804 over the connection or link 818. Still further, playlists identifying certain of the media assets can also be sent by the management module 806 over the connection or link 818 to media storage 820 or the media database 822 within the media player 804.

Furthermore, the media player 804 includes a play module 824 that couples to media storage 820 and the media database 822. The play module 824 is a software module that can be utilized to play certain media assets stored in media storage 820.

Hence, in one embodiment, the media player 804 has limited or no capability to manage media assets or data files on the media player 804. However, the management module 806 within the host computer 802 can indirectly manage the media assets residing on the media player 804. For example, to "add" a media asset to the media player 804, the management module 806 serves to identify the media asset to be added to the media player 804 from media storage 808 and then causes the identified media asset or data to be delivered to the media player 804. As another example, to "delete" a media asset from the media player 804, the management module 806 serves to identify the media asset to be deleted from media storage 808 and then causes the identified media asset to be deleted from the media player 804. As still another example, if changes (i.e., alterations) to characteristics of a media asset were made at the host computer 802 using the management module 806, then such characteristics can also be carried over to the corresponding media asset on the media player 804. In one implementation, the additions, deletions and/or changes occur in a batch-like process during synchronization of the media assets on the media player 804 with the media assets on the host computer 802.

Alternately, in some embodiments, data storage on the media player 804 is designated file storage 821 and is combined with or physically and/or logically separate from media storage 820. As discussed above, in some embodiments, the management module 806 is normally not involved in transferring data between file storage 809 on the host computer 802 and file storage 821 on the media player 804. In these embodiments, the file manager 815 running on the host computer 802 can be used to manage the transfer of data between file storage 809 and file storage 821. For example, when using the file manager 815, the media player 804 appears as a USB drive and data files are accessed as if the media player 804 was a conventional USB drive.

In another embodiment, the media player 804 has limited or no capability to manage playlists on the media player 804. However, the management module 806 within the host computer 802 through management of the playlists residing on the host computer can indirectly manage the playlists residing on the media player 804. In this regard, additions, deletions or changes to playlists can be performed on the host computer 802 and then be carried over to the media player 804 when delivered thereto.

As previously noted, synchronization is a form of media management. The ability to automatically initiate synchronization was also previously discussed above and in the related application noted above. Still further, however, the synchronization between devices can be restricted so as to prevent automatic synchronization when the host computer and media player do not recognize one another.

In one implementation, the host computer can utilize an application resident on the host computer to permit utilization and provide management for playlists. One such application is iTunes®, produced by Apple Computer, Inc. of Cupertino, Calif.

Another embodiment of the invention relates to a portable media device, such as a portable media player, having one or more status indicators. The status indicators can provide useful user feedback, which is particularly useful when the portable device lacks a display screen (display), such as a LCD display. The status indicators can be audio or visual.

Figure 9A:
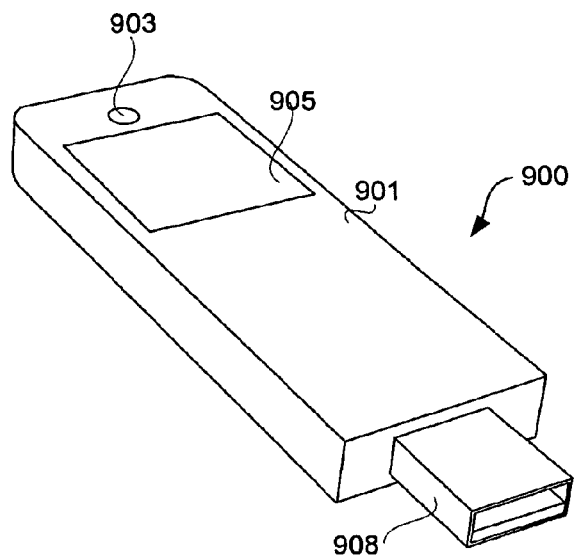
FIGS. 9A and 9B are block diagrams of a top surface of a media device according to one embodiment of the invention.
Figure 9B:
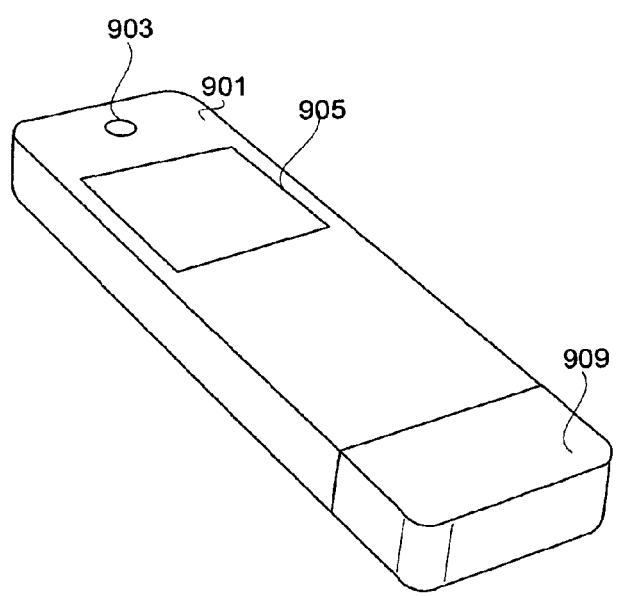

FIGS. 9A and 9B are block diagrams of a top surface 901 of a media device 900 according to one embodiment of the invention. The media device 900 is, for example the media device 100 of FIG. 1 or the media device 200 shown in FIGS. 2A and 2B. The media device 900 has a media device status indicator 903 to indicate an associated media device status. According to the embodiment shown, the media device status indicator 903 is a visual media device status indicator. For example, the visual status indicator can be implemented by one or more LEDs. If more than one LED is used, the one or more LEDs can have different colors to indicate different media device states. The one or more LEDs can be placed such that they are located in close proximity to each other so it appears to a user that a single status indicator 903 changes color as the media device status changes. The media device 900 shown also has a user control panel 905, which can be one or more switches, buttons, joysticks, touchpads, etc. In one embodiment, the user control panel 905 is the control input device 208 illustrated in FIG. 2A. In some embodiments, the status indicator 903 may be integral with one or more user controls (not shown) located on the user control panel 905.

Additionally, one embodiment of the invention includes an integral peripheral bus connector 907 and a rechargeable battery (not shown). The rechargeable battery can be charged when the portable media device 900 is connected to a peripheral bus via the peripheral bus connector 907. As noted above, a USB connector or a FireWire® connector are examples of a peripheral bus connector. In some embodiments, a removable cap 909 can be used to protect and/or conceal the peripheral bus connector 907.

In one embodiment of the invention, two LEDs of different colors are used as the media device status indicator 903. In this embodiment, a first color LED is used to give a user visual feedback corresponding to the user operating one or more user controls. A second color is used to give the user visual feedback that the media device 900 is being charged. The first color LED can blink once each time a user operates a first user control (e.g., a volume control) on the user control panel 905. If a second user control (e.g., a play/pause control) on the user control panel 905 is operated, then the first color LED blinks steadily while the selected action continues. According to this embodiment, the second color LED, which emits a different color than the first color LED, blinks steadily while the media device 900 is charging, for example, when the media device 900 is plugged into a peripheral bus capable of supplying power to the media device 900.

Figure 9C:
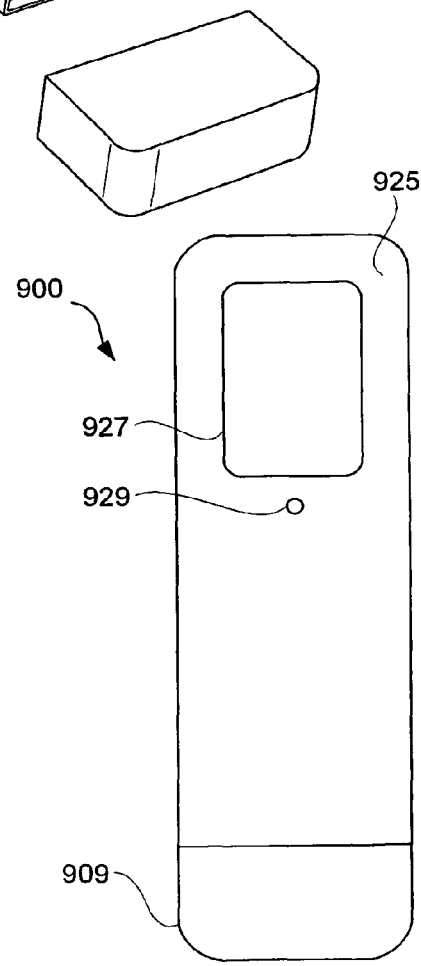
FIG. 9C is a block diagram of a second surface of the media device shown in FIGS. 9A and 9B according to one embodiment of the invention.

FIG. 9C is a block diagram of a second surface 925 of media device 900 shown in FIGS. 9A and 9B according to one embodiment of the invention. The media device 900 has a media status indicator 929 to indicate an associated media device status. According to the embodiment shown, the media device status indicator 929 is a visual media device status indicator. For example, the visual status indicator can be implemented by one or more LEDs. If more than one LED is used, the one or more LEDs can have different colors to indicate different media device states. In one embodiment, the one or more LEDs are placed such that they are located in close proximity to each other so it appears to a user that a single status indicator 929 changes color as the media device status changes. The media device 900 shown also has a user control panel 927, which can be one or more switches, buttons, joysticks, touchpads, etc. In one embodiment, the user control panel 927 is the control input device 208 illustrated in FIG. 2A. In one embodiment, the status indicator 929 may be integral with one or more user controls located on the user control panel 927. For example, the status indicator 222 discussed above with reference to FIG. 2A can be considered integral with the button 224.

In one embodiment of the invention, three LEDs of different colors are used to implement the media device status indicator 929. In this embodiment, each of the three colors of LED is used to give a user visual feedback corresponding to a different battery condition. In order to conserve battery life, in some embodiments, the media device status indicator 929 is activated by a user control (not shown), such that the media device indicator 929 operates for a short period of time (e.g., 5 seconds) after the user operates the user control.

For example, in one embodiment, the first color LED lights up to indicate that a battery that powers the media device 900 is mostly charged. Over time, as the media device 900 is operated, the battery discharges to a first predetermined voltage indicative of a partially charged battery. Accordingly, the first color LED switches off and second color LED lights up to indicate to the user that the battery has partially discharged. As the battery continues to discharge to a second predetermined voltage, the second color LEDs switches off and a third color LED lights up to indicate to the user that the battery is mostly discharged. Finally, when the battery is almost completely discharged, a single LED (of any color) blinks steadily to indicate to the user that the media device 900 is preparing to shut down because the battery level is insufficient to continue operating the media device 900. Thereafter, the media device status indicator ceases to give any indication (i.e., none of the LEDs light up) indicating to the user that the battery is substantially completely discharged and must be recharged before the media device 900 can be used again.

Figure 10A:
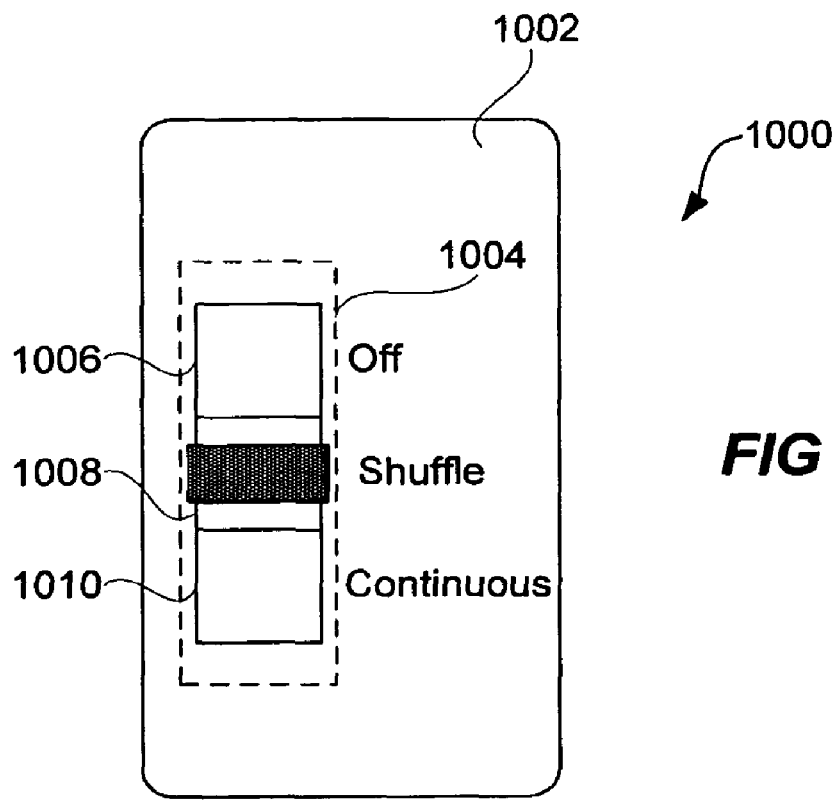
FIGS. 10A and 10B are diagrams illustrating user controls for a portable media device according to one embodiment of the invention.
Figure 10B:
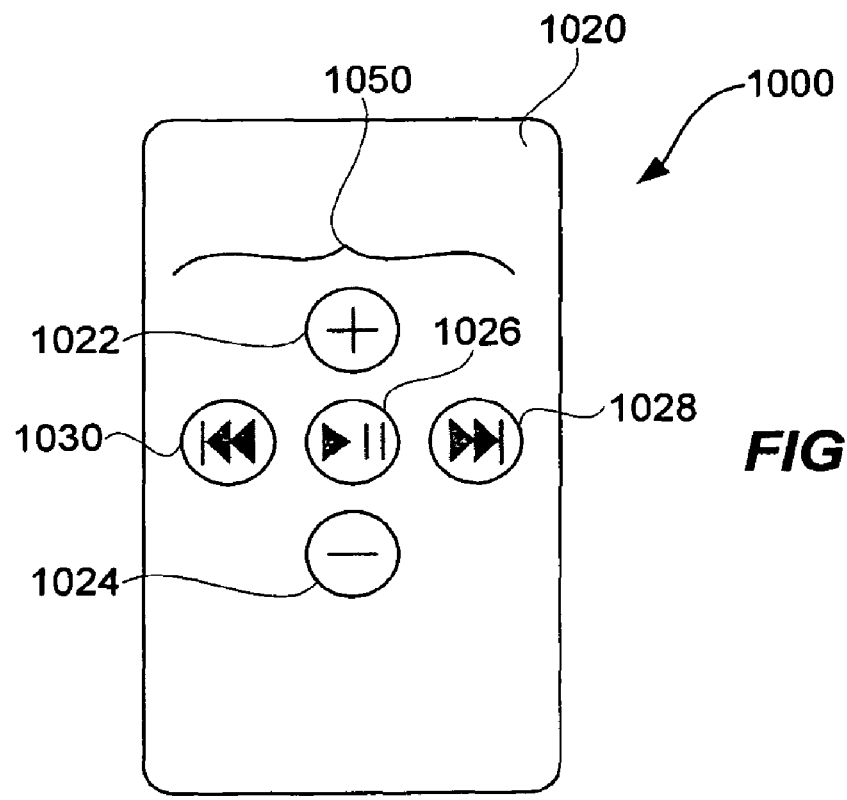

FIGS. 10A and 10B are diagrams illustrating user controls for a portable media device 1000 according to one embodiment of the invention.

FIG. 10A illustrates a first control surface 1002 of the media device 1000, which contains a three-position switch 1004. The three-position switch 1004 can be switched between an off position 1006, a shuffle play mode position 1008, and a continuous play mode position 1010. The shuffle play mode position 1008 can correspond to a media device shuffle play mode as discussed above in reference to FIG. 7 and again below in reference to FIGS. 13-16. Generally, in the shuffle play mode, the media device plays through a group of media assets in a random order. The continuous play mode position 1010 can correspond to a media device continuous play mode, wherein the media device plays through the list of media assets according to a default order. The off position 1006 allows a user to power off the portable media device 1000. The three-position switch 1004 is shown in the shuffle play mode position 1008. In one embodiment of the invention, the three-position switch 1004 is located on the user control panel 927 of FIGS. 9A and 9B. In another embodiment of the invention, the three-position switch 1004 can be implemented as the sliding modal switch 214 of FIG. 2B.

FIG. 10B illustrates a second control surface 1020 of the media device 1000, which contains a set of media device controls 1050. These media device controls 1050 include a volume up control 1022, a volume down control 1024, a pause/play control 1026, a next/fast forward control 1028, and a previous/rewind control 1030. In one embodiment of the invention, the media device controls 1050 are located on the user control panel 905 of FIGS. 9A and 9B. In some embodiments of the invention, the set of media device controls 1050 can be implemented as the clickable button actuator 208 illustrated in FIG. 2A. Further, in some embodiments, one or more of the media device controls are overloaded such that it has more than one function. For example, the pause/play control 1026 can function as a hold button, disabling the media device controls to prevent accidental control inputs (e.g., when the media device is in a pocket). In this embodiment, the pause/play control is pressed and held down for a predetermined period of time (e.g., 3 seconds) to initiate the media device control hold. To cancel the hold, the pause/play control 1026 is pressed and held in the same manner as used to initiate the media device control hold.

Another aspect of the invention relates to a portable media player with the capability of storing media player status information in persistent memory before powering down. Thereafter, when the portable media player is again powered up, the stored media player status information can be retrieved and utilized. In effect, the portable media player can remember where it was playing media assets when turned off, so that when later turned on it can play the media assets from where it left off.

Figure 11:
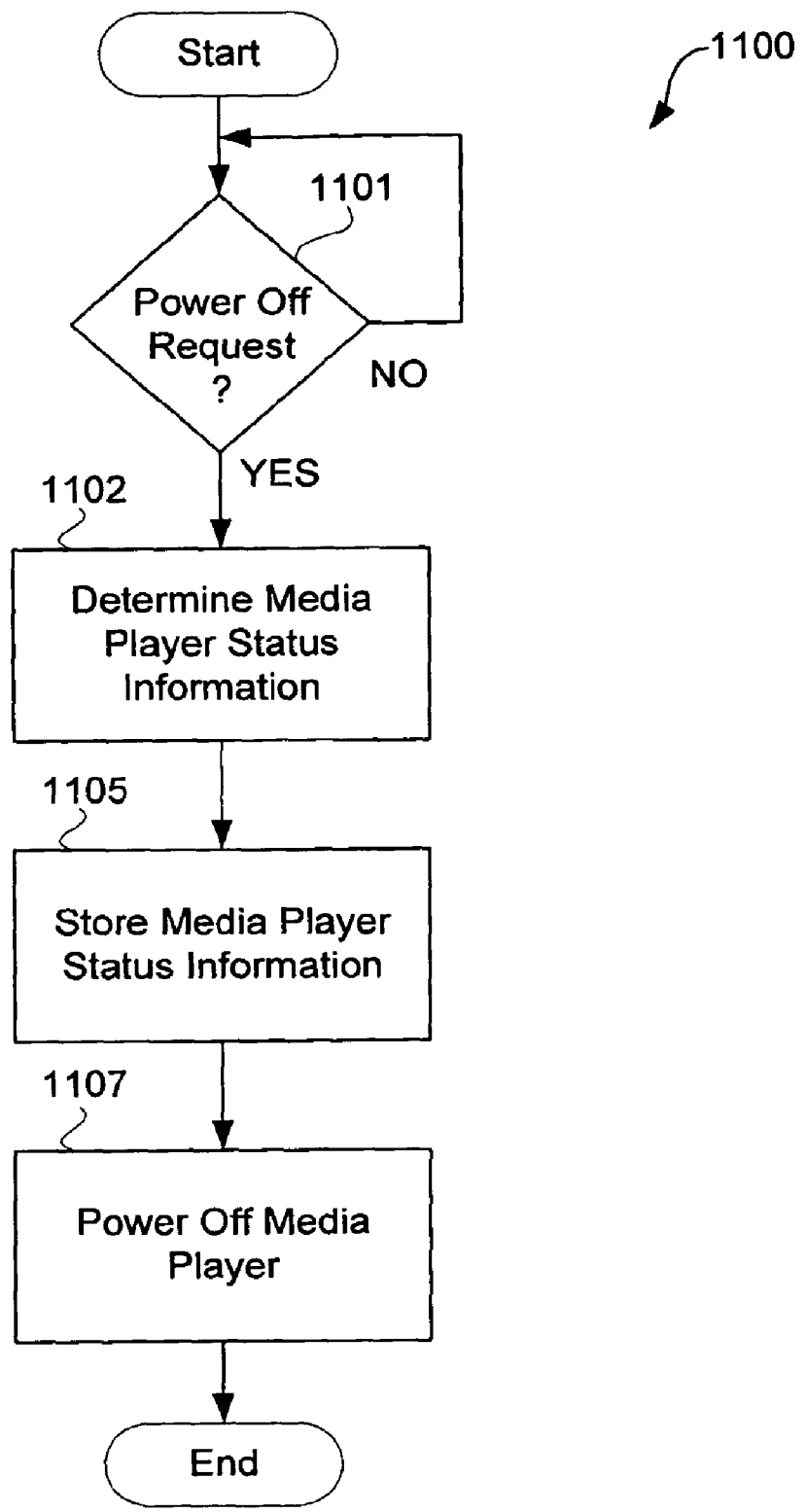
FIG. 11 is a flow diagram of a media player power-down process according to one embodiment of the invention.

FIG. 11 is a flow diagram of a media player power-down process 1100 according to one embodiment of the invention. The media player power-down process 1100 is, for example, performed by a media player. For example, the media player can be the media device 100, 200, 700 or 900 illustrated in FIGS. 1, 2A, 2B, 7 and 9A-9C. More generally, the media player can be practiced with any media player with persistent memory storage capabilities. In one embodiment, the persistent memory is non-volatile memory, such as FLASH memory. For example, the file system 704 in FIG. 7 can provide persistent storage.

The media player power-down process 1100 begins with a decision 1101 that determines if a power off request has been received. The power off request can originate from a user action or a system command. An example of a user action is operating an off switch. Alternatively, if the power off request comes from a system command, the command may be the result of a user-set preference, such as after a predetermined period of inactivity or a low battery condition.

Once a power off request has been received, the media player power off process 1100 determines 1102 media player status information from the media player. For example, the media player status information can be determined by a processor operating the media player, such as the processor 702 shown in FIG. 7. For example, the media player status information can be considered state information of the media player. The state information characterizes the state of the media player so that the media player can later resume playing from the same (or substantially the same) state. The media player status information includes, but is not limited to, one or more of: the current media asset being presented (e.g., played) (i.e., media asset pointer), the current position in the media asset (e.g., elapsed time in current media asset) (i.e., media asset position), media player volume, media player pause status, and current media asset playlist. In some embodiments, a media asset playlist validity indicator (described below) is also stored. The media player status information can be represented by status indicators. Table 1 contains an exemplary list of media player status information status indicators, as well as exemplary variable names and sample values.

TABLE 1

| Status Indicator | Variable Name | Sample Values |
| --- | --- | --- |
| Current Playlist | Playlist_pointer (pp) | {continuous, shuffle} |
| Current Media Asset | Media_asset_pointer (map) | Pointer to memory location |
| Current Media Asset Position | Media_asset_position (pos) | Time |
| Current Media Player Volume | Volume_level (vol) | Volume Level |
| Current Media Player Pause Status | Pause_status (ps) | {pause, play} |
| Current Playlist Validity | Valid_list_flag (v?) | {valid, invalid} |

Next, media player status information is stored 1103 in persistent memory of the media player. For example, the media player status information can be stored in memory of the media player, such as FLASH memory or other non-volatile memory. Subsequently, the media player is powered off 1105. The media player power-down process 1100 is then complete and ends.

Figure 12:
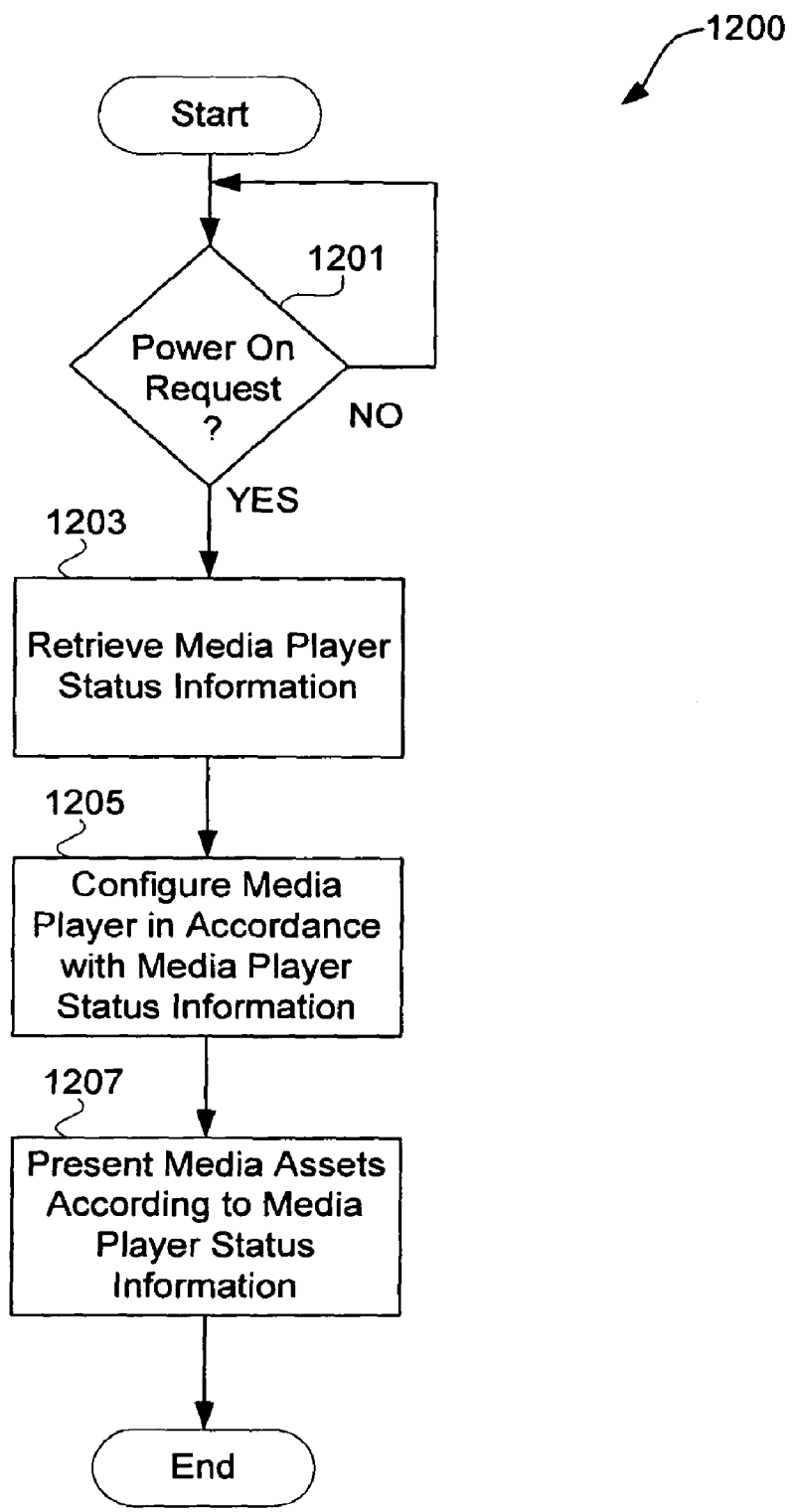
FIG. 12 is flow diagram of a media player power-on process according to one embodiment of the invention.

FIG. 12 is flow diagram of a media player power-on process 1200 according to one embodiment of the invention. The media player power-on process 1200 restores the media player to a state that is substantially the same as when the media player status information was stored. In one embodiment, the media player is restored to the media player state that existed at the time the media player was powered off, such as according to the media player power-down process 1100 of FIG. 11. The media player power-on process 1200 is, for example, performed by a media player. For example, the media player can be the media device 100, 200, 700 or 900 illustrated in FIGS. 1, 2A, 2B, 7 and 9A-9C.

The media player power-on process 1200 begins with a decision 1201, which determines if a power on request has been made. The power on request can originate from a user action or a system command. An example of a user action is operation of an on switch to issue a power on request. If the power on request comes from a system command, the command can, for example, be the result of connection of the media player to a host computer.

Once the decision 1201 determines that the power on request has been made, media player status information is retrieved 1203 from persistent memory. For example, the media player status information can be retrieved 1203 from memory of the media player, such as FLASH memory or other non-volatile memory. According to one embodiment of the invention, the media player status information retrieved 1203 can be considered state information for the media player. The state information characterizes a state of the media player so that the media player can be returned to the same (or substantially the same) state it had when it was previously powered off. The media player status information includes, but is not limited to, one or more of a media asset pointer, a media asset position (e.g., elapsed time), a media player volume, a media player pause status, and a media asset playlist. In another embodiment, the media player status information includes status indicators. For example, the status indicators can be any one or more of the media player status information status indicators shown in Table 1 above. Typically, the retrieved media player status information was previously stored when the media player was previously powered off, but may also be default values or values previously set by a user. For instance, the media player volume indicator may automatically be set at a default value to prevent an unexpectedly loud volume level in a user's headphones when the media player starts. Further, in some embodiments, a media asset playlist validity indicator can also be retrieved 1203 as part of the media player status information.

After the media player status information has been retrieved 1203, the media player is configured 1205 according to the retrieved media player status information. In one embodiment, the media player is configured 1205 such that it is the same or substantially the same state as it was when the media player status information was stored in persistent memory. Finally, the media player presents 1207 one or more media assets according to the media player status information. Thereafter, the media player power-on process 1200 ends.

Still another aspect of the invention relates to a method for traversing a media asset playlist. The method includes the presentation of one or more media assets in one or more media asset playlists, including at least a media asset continuous playlist and a media asset shuffle playlist. Further, the method describes the circumstances under which a new media asset shuffle playlist is created. These methods are well suited for performance on portable media devices where resources or power is often limited.

Figure 13:
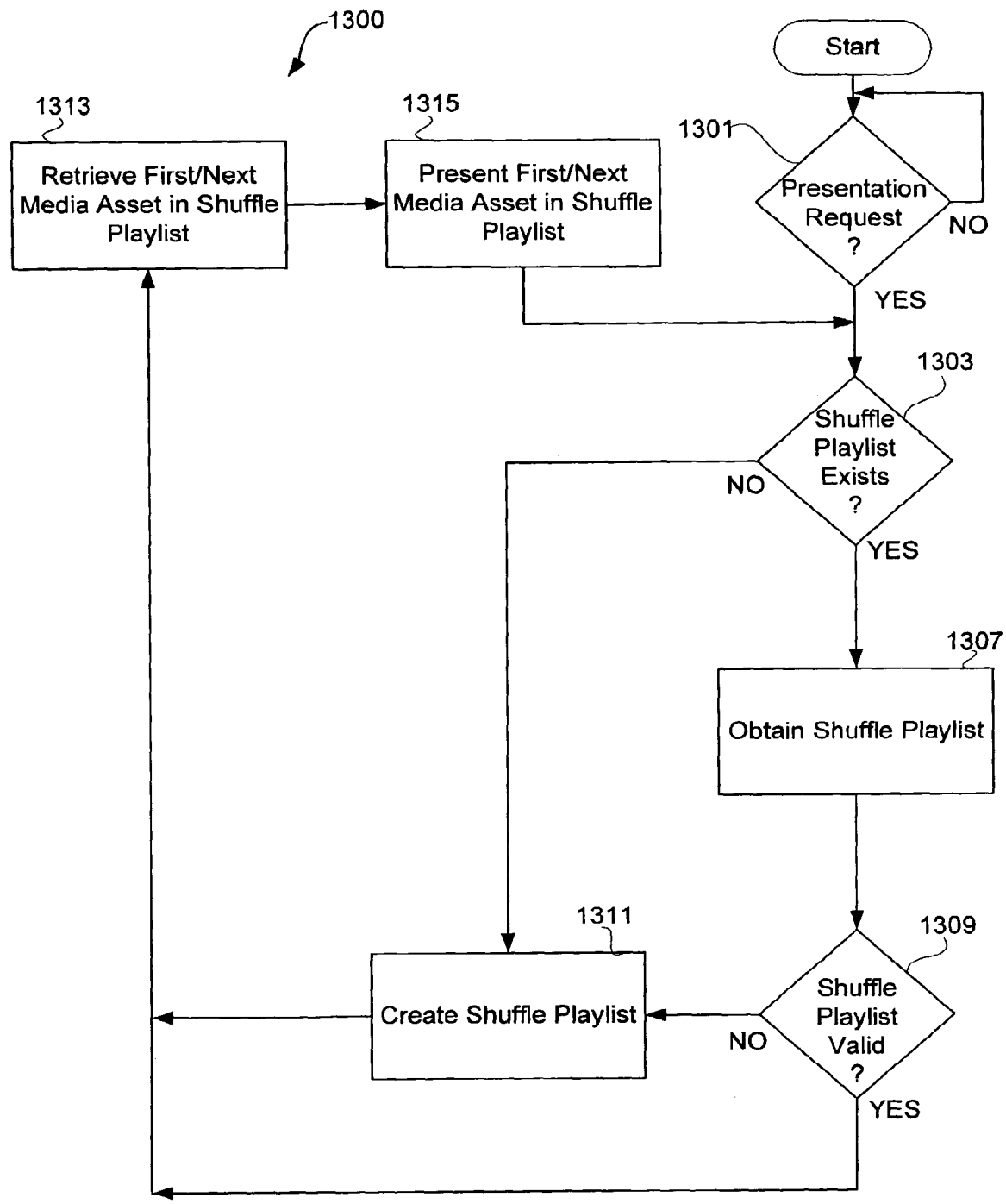
FIG. 13 is a flow diagram of a media asset shuffle playlist traversal process according to one embodiment of the invention.

FIG. 13 is a flow diagram of a media asset shuffle playlist traversal process 1300 according to one embodiment of the invention. This embodiment is used to traverse a media asset shuffle playlist using a media player, for example, the media device 100, 200, 700 or 900 illustrated in FIGS. 1, 2A, 2B, 7 and 9A-9C. The media asset shuffle playlist ("shuffle playlist") is one type of media asset playlist. For example, the media asset shuffle playlist represents a shuffled version of a media asset playlist. In some embodiments of the invention the media asset shuffle playlist is a randomly generated playlist that has been generated locally on the media player. Other embodiments may randomly generate a playlist on a host computer such as the host computer 802 of FIG. 8.

The media asset shuffle playlist traversal process 1300 begins with a decision 1301 that determines if a presentation request has been received. The presentation request can be a user request or a system request. As noted above, a presentation operation is used by a media player to present (e.g., play) a media asset. Besides presenting a media asset, other common operations supported by a media player include fast forwarding or rewinding through a media asset, and skipping forward to a next media asset or backward to a previous media asset. If a presentation request has not been received, the media asset shuffle playlist traversal process 1300 waits until a presentation request is received. On the other hand, if a presentation request has been received, a decision 1303 determines if a shuffle playlist exists. If the decision 1303 determines that there is no existing shuffle playlist, a shuffle playlist is created 1311. Following the creation 1311 of the shuffle playlist, a media asset from the shuffle playlist is retrieved 1313. The retrieved media asset is typically the first media asset of the shuffle playlist, if the shuffle playlist has been newly created. Next, the retrieved media asset is presented 1315 (e.g., played) on the media asset player. After the retrieved media asset from the shuffle playlist is presented 1315, the media asset shuffle playlist traversal process 1300 returns to the decision 1303 and subsequent blocks. Note that, according to some embodiments of this invention, "presenting" a media asset means using the media device to output audio. However, presenting can also include at least operations commonly associated with a typical media player, including fast forwarding or rewinding through a media asset, and skipping forward to a next asset or backward to a previous media asset.

Alternatively, when the decision 1303 determines that a shuffle playlist does exist, the shuffle playlist is obtained 1307. For example, the shuffle playlist can be obtained 1307 can by retrieving a pointer to the shuffle playlist or a current media asset in the shuffle playlist. Next, decision 1309 determines if the obtained shuffle playlist is valid. In one embodiment, the validity of a shuffle playlist can be indicated by a flag or other indicator stored in the media player. If decision 1309 determines that the shuffle playlist is not valid, the media asset shuffle playlist traversal process 1300 creates 1311 a shuffle playlist and then continues to block 1313 and subsequent blocks as discussed above. On the other hand, if decision 1309 determines that the shuffle playlist is valid, the media asset shuffle traversal process 1300 continues directly to block 1313 and subsequent blocks.

Although the media asset shuffle playlist traversal process 1300 applies to a shuffle playlist, it should be understood that the media asset shuffle playlist traversal process 1300 can also be applied to other types of playlist. Additionally, in some embodiments of the invention, the status of the media asset shuffle playlist is stored upon a power-down process such as, for example, the media player power-down process 1100 of FIG. 11. Further, in some embodiments of the invention, the status of the media asset shuffle playlist is retrieved during a power on process, such as the media player power-on process 1200 of FIG. 12.

Figure 14A:
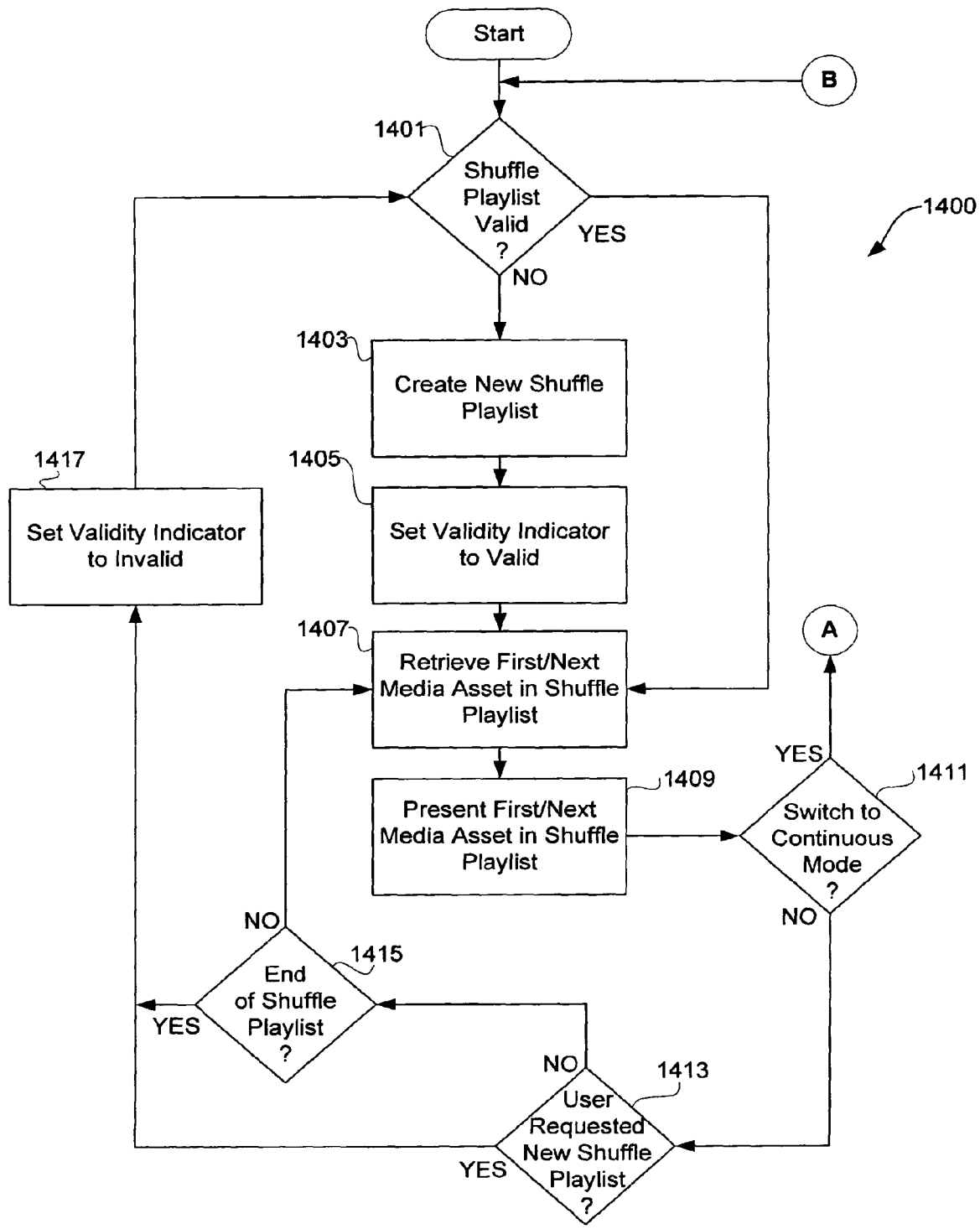
FIGS. 14A and 14B are flow diagrams of a media asset list traversal process according to one embodiment of the invention.
Figure 14B:
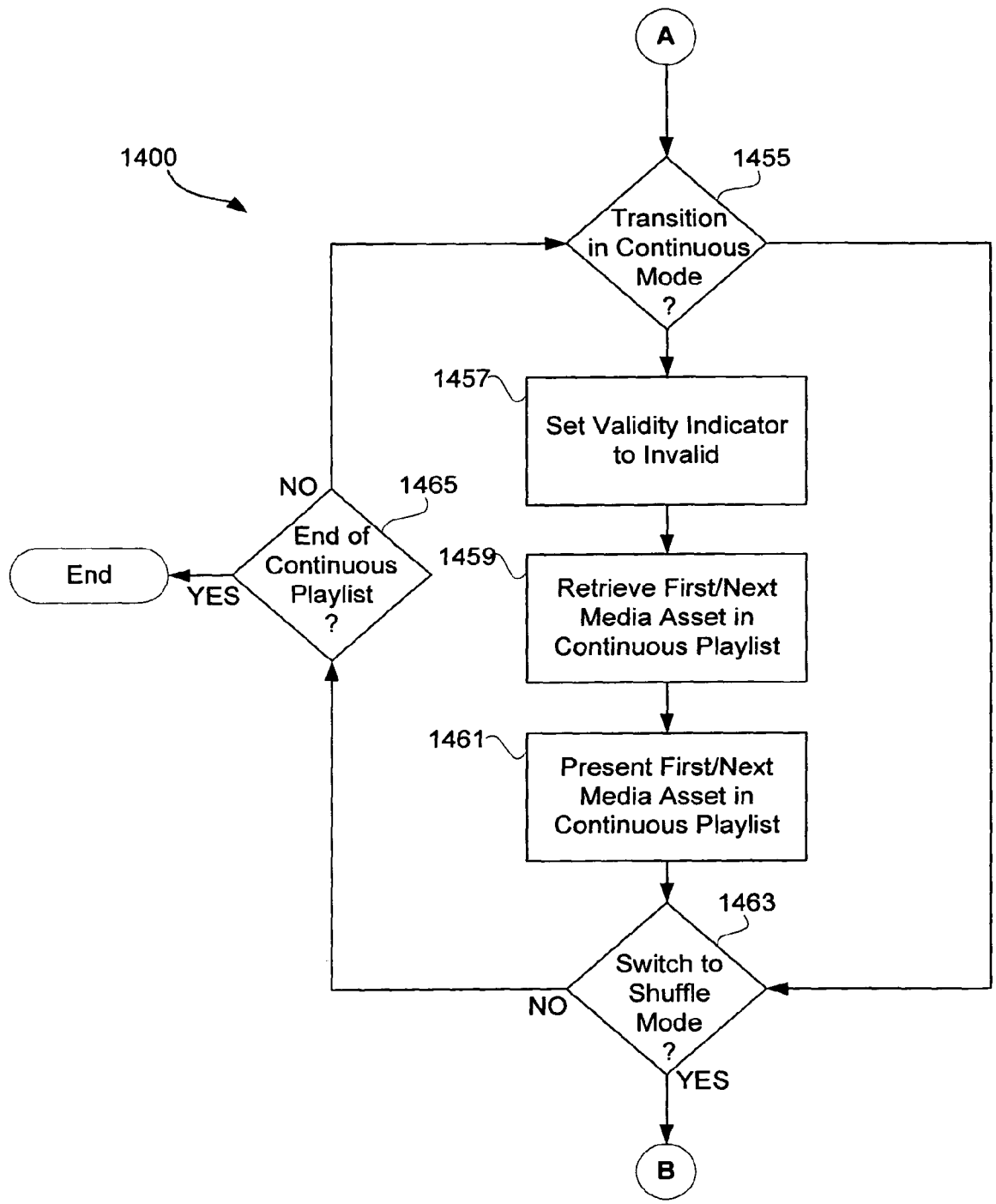

FIGS. 14A and 14B are flow diagrams of a media asset list traversal process 1400 according to one embodiment of the invention. The media asset list traversal process 1400 is, for example, performed by a media player, for example, the media device 100, 200, 700 or 900 illustrated in FIGS. 1, 2A, 2B, 7 and 9A-9C.

The media asset list traversal process 1400 begins with decision 1401, which determines whether a media asset shuffle playlist is valid. For example, the decision 1401 can occur when a media asset shuffle playlist is accessed, for instance during operation 1307 of FIG. 13. In some embodiments, a validity determination can be made by examining the value of a playlist validity indicator. If the decision 1401 determines that the media asset shuffle playlist is valid, a first or/next media asset on the media asset shuffle playlist is retrieved 1407 and presented 1409. Typically, if the media asset playlist is new, the first media asset on the media asset shuffle playlist is retrieved 1407. However, if the media asset shuffle playlist has been partially traversed (e.g., some media assets on the media asset shuffle playlist have already been presented 1409), then the next media asset on the media asset playlist will be retrieved 1407. On the other hand, if the decision 1401 determines that the media asset shuffle playlist is invalid, a new media asset shuffle playlist is created 1403, and a validity indicator associated with the new media asset shuffle playlist is set 1405 to valid. Techniques for creating a shuffle sequence are well understood in the art. For example, one technique uses a random number generator—an example of which can be found in U.S. Pat. No. 6,707,768, which is hereby incorporated by reference herein in its entirety for all purposes. The validity indicator can be, for example, the Current Playlist Validity status indicator shown in Table 1. Following the block 1405, the media asset shuffle list creation process continues to block 1407.

Following the retrieval 1407 of the first or next media asset on the media asset shuffle playlist, the retrieved media asset is presented 1409 (e.g., played). Next, a decision 1411 determines if the media player has been switched to a continuous mode, where the continuous mode is associated with a media asset continuous playlist. For example, the media player can be switched to a continuous mode by using an input device, such as a switch. Typically, according to some embodiments, to activate the continuous mode, a user manually switches a switch of the media player to continuous mode setting, possibly because the user no longer wishes to listen to the currently selected shuffle playlist. A media asset continuous playlist according to one embodiment of the invention is described below in reference to FIGS. 15A and 15B.

If decision 1411 determines that the media player has been switched to a continuous mode, then the media asset shuffle list creation process 1400 continues to other processing associated with traversal of a media asset continuous playlist. Otherwise, decision 1413 determines if a user of the media player makes a request that the media player create 1403 a new media asset shuffle playlist. The user request is, according to some embodiments of the invention, initiated by operating a media player control. A dedicated media player control can be used or an existing media player control can be overloaded so as to function to make the new media asset shuffle playlist request. In some embodiments of the invention, a media player control, for example the pause/play control 1026 of FIG. 10, is overloaded such that, if it is pressed several times in rapid succession, a request to create 1403 a new media asset shuffle playlist is made. In some embodiments, the creation of a new shuffle playlist is initiated by pressing the media player control 3 times in rapid succession, for example 3 times in 2 seconds.

If the decision 1413 determines that the user has made a request to create a new media asset shuffle playlist, the media asset playlist validity indicator is set 1417 to 'invalid'. On the other hand, if the user does not request the creation of a new media asset shuffle playlist, then decision 1413 directs the media asset shuffle playlist creation process 1400 to decision 1415 and subsequent blocks. The decision 1415 determines if the end of the shuffle playlist has been reached, whereupon the media asset playlist validity indicator is set 1417 to 'invalid'. Alternately, if the end of the shuffle playlist has not been reached, the media asset list traversal process 1400 returns to block 1407 and subsequent blocks. Next, regardless of how the block 1417 is reached, following the block 1417 the media asset shuffle list creation process 1400 returns to block 1401 and subsequent blocks.

More particularly, when decision 1411 determines that the media player has been switched to continuous mode, decision 1455 determines if a media player has reached a transition between media assets (e.g., the end of a song). If so, the media asset playlist validity indicator is set 1457 to 'invalid'. Alternatively, if a transition is not reached while the media player is playing in continuous mode, then the media asset list traversal process 1400 continues to decision 1463 and subsequent blocks. At decision 1463, a determination is made whether the media player has been switched to continuous mode. If the media player has been switched to continuous mode, the media asset list traversal process 1450 returns to decision 1402 of the media asset shuffle playlist process 1400. On the other hand, if the media player has not been switched to shuffle mode, decision 1463 directs the media asset list traversal process 1450 to decision 1455 and subsequent blocks. Note that, according to this embodiment, if the user switches the media player back to shuffle mode before a media asset transition is reached, the media asset playlist validity indicator is not set to 'invalid'.

Next, the first or next media asset on the media asset continuous playlist is retrieved 1459 and presented 1461. According to one embodiment of the invention, if the media player has just been switched to continuous mode from shuffle mode, for example before decision 1411 of FIG. 14A, then the media player retrieves 1459 and presents 1461 the first media asset on the media asset continuous playlist. However, if the media asset continuous playlist has been partially traversed (e.g., some media assets on the media asset shuffle playlist have already been presented 1461) then the next media asset on the media asset playlist will be retrieved 1407. Thereafter, the media asset list traversal process 1400 continues to decision 1463 and subsequent blocks.

According to some embodiments of the invention, if the end of the media asset continuous list is reached, the media asset list traversal process 1400 starts over at the first media asset on the media asset continuous list. However, in other embodiments, an optional decision 1465 is added. If decision 1465 determines that the end of the media asset continuous list has been reached, then the media asset list traversal process 1400 ends. Otherwise, according to these embodiments, the media asset list traversal process 1400 continues to decision 1455 and subsequent blocks.

Figure 15A:
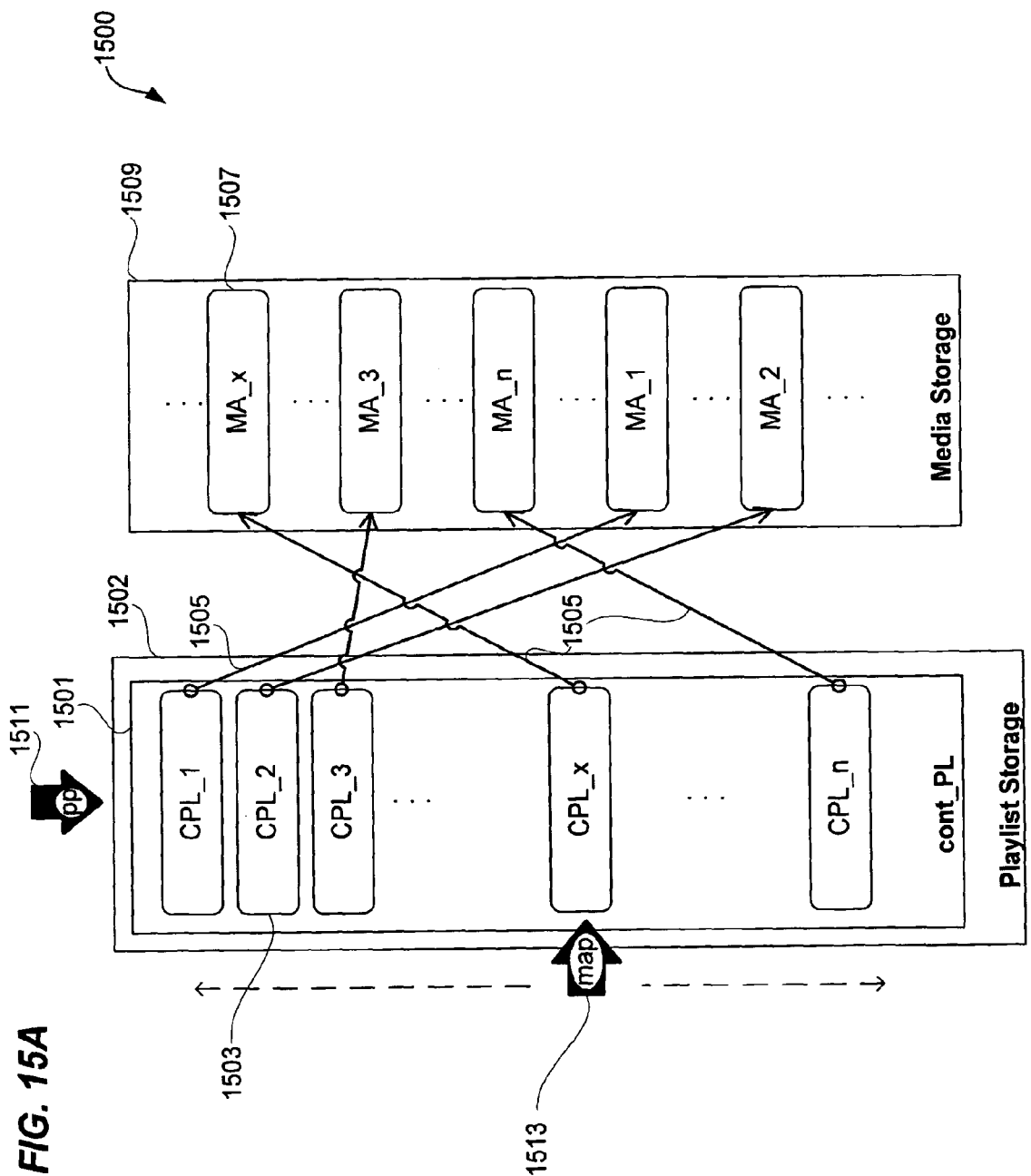
FIGS. 15A and 15B are illustrations of an exemplary media asset playlist arrangement according to one embodiment of the invention.
Figure 15B:
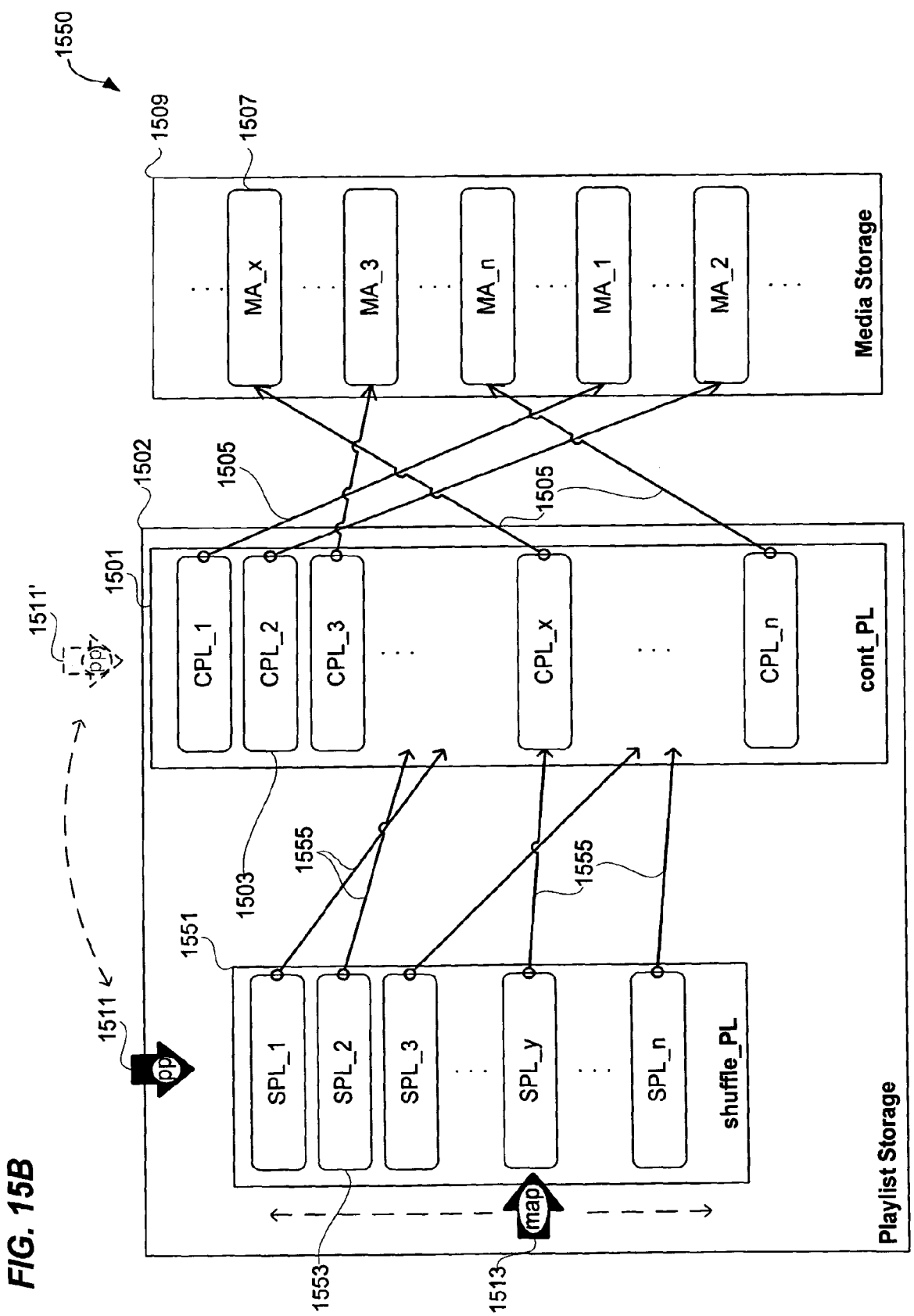

FIGS. 15A and 15B are illustrations of an exemplary media asset playlist arrangement according to one embodiment of the invention. In some embodiments of the invention, the media asset playlists are stored in persistent memory. In other embodiments, the media asset playlists are stored in volatile memory. The playlist arrangement is suitable for use with a portable media player, for example the media device 100, 200, 700 or 900 illustrated in FIGS. 1, 2A, 2B, 7 and 9A-9C.

FIG. 15A illustrates a media asset playlist arrangement 1500 where a media asset playlist 1501 contains continuous playlist media asset data entries 1503. The media asset data entries 1503 contain pointers 1505 to media assets 1507 which are located in media storage 1509. The media storage 1509 is, for example, the media storage 820 in the media player 804 of FIG. 8. Additionally, a playlist pointer (pp) 1511 and a media asset pointer (map) 1513 are shown. The playlist pointer 1511 serves to keep track of the currently selected playlist. In some embodiments, operating a media player control, such as a switch, alters the playlist pointer 1511 to point to another playlist. FIG. 15 shows a single playlist stored in the playlist storage 1502. However, multiple playlists are used in some embodiments (see FIG. 15B). The media asset pointer 1513 points to the current media asset 1507 being presented (e.g., played).

In the embodiment shown in FIG. 15, the media asset playlist 1501 is a continuous media asset playlist (cont_PL). The continuous media asset playlist 1501 is typically a playlist where media assets are arranged in a particular, non-random order. For example, the continuous media playlists 1501 can be arranged by artist, author, album, or in alphabetical order. Alternatively, the continuous media asset playlist 1501 may be arranged in a user specified order. Typically, the continuous media asset playlist 1501 is static (i.e., unchanging). However, in some embodiments the media asset playlist 1501 may be altered using a media management application running on a host computer, for example, the management module 206 running on the host computer 202 of FIG. 2.

As noted above, the media asset pointer 1513 points to the currently selected media asset data entry 1503 (designated CPL_x in FIG. 15). When the media asset playlist 1501 is traversed, the media asset pointer 1513 moves to the next continuous playlist media asset data entry 1503 in the media asset playlist 1501 upon completion of presenting of the media asset 1507 pointed to be the pointer 1505 (e.g., after a song has finished playing). For example, the media asset playlist 1501 can be traversed by a media asset playlist traversal process. The typical media asset playlist traversal process begins at the first continuous playlist media asset data entry 1503 in the playlist and traverses the media asset entries 1503 sequentially from the start of the media asset playlist (designated CPL_1 in FIG. 15) to the end of the media asset playlist (designated CPL_n in FIG. 15). Note that a person of ordinary skill in the art would understand that the order of the media assets 1507 in the media store is not important. Accordingly, FIG. 15 shows the media assets 1507 organized in a different order than the continuous playlist media asset data entries 1503.

One example of presenting a media asset 1507 using the media asset playlist arrangement 1500 involves a media player accessing the particular playlist media asset data entry 1503 that the media asset pointer 1513 is currently pointing to. Next, the pointer 1505 associated with the continuous playlist media asset data entry 1503 is followed to locate the media asset 1507.

FIG. 15B illustrates a media asset playlist arrangement 1550 according to one embodiment of the invention. The descriptions given for 1501-1509 in FIG. 15 also apply to FIG. 15B. Additionally, FIG. 15B shows a media asset shuffle playlist 1551 stored in playlist storage 1502. The media asset shuffle playlist 1551 (shuffle_PL) contains shuffle playlist media asset data entries 1553 which contain pointers 1555 to continuous playlist media asset data entries 1503. Note that this arrangement of pointers is merely one way to describe a shuffle playlist and is intended to be for illustrative purposes only. Those skilled in the art of computer programming will understand that there are many ways to implement a shuffle playlist and that this description is intended to be exemplary.

As discussed above with reference to FIG. 15, the playlist pointer (pp) 1511 is also shown in FIG. 15B. In FIG. 15B, the playlist pointer 1511 points to the media asset shuffle playlist 1551. However, the playlist pointer 1511 may point to any playlist (as indicated by the dotted line and playlist pointer 1511'). In some embodiments, operating a media player control, such as a switch, causes the playlist pointer 1511 to be moved to point to another playlist. By way of example, either of the two playlists shown in FIG. 15B (shuffle_PL and cont_PL) may be selected by operating a media player control. In one implementation, the media player control can be a multi-position switch with at least a 'shuffle' and a 'continuous' position.

Further, the media asset pointer 1513 points to the currently selected media asset data entry 1553 (designated SPL_y in FIG. 15B). When the media asset shuffle playlist 1551 is traversed, the media asset pointer 1513 moves to the next shuffle playlist media asset data entry 1553 in the media asset playlist 1551 upon completion of presenting the media asset 1507 corresponding to the currently selected media asset data entry 1553 (e.g., after a song has finished playing). For example, the media asset shuffle playlist 1551 can be traversed by the media asset shuffle playlist traversal process 1300 of FIG. 13. However, in general, a typical media asset playlist traversal process begins at the first shuffle playlist media asset data entry 1553 in the playlist and traverses the shuffle playlist media asset data entries 1553 sequentially from the start of the media asset shuffle playlist (designated SPL_1 in FIG. 15) to the end of the media asset shuffle playlist (designated SPL_n in FIG. 15).

One example of presenting a media asset 1507 using the media asset playlist arrangement 1550 involves a media player accessing the particular shuffle playlist media asset data entry 1553 that the media asset pointer 1513 is currently pointing to. Next, the pointer 1555 associated with the shuffle playlist media asset data entry 1553 is followed to the continuous playlist media asset data entry 1503. Subsequently, the pointer 1505 associated with the continuous playlist media asset data entry 1503 is followed to the media asset 1507, which is presented according to the capabilities of the media player.

Note further, in a typical media asset shuffle playlist creation process such as, for example, the media asset shuffle playlist creation process 1400 of FIG. 14, the pointer 1555 associated with a particular shuffle playlist media asset data entry 1553 will usually point to a different continuous playlist media asset data entry 1503 whenever a new media shuffle playlist is created. By way of example (and without restricting the scope of the invention), it is possible to view the creation of a new media asset shuffle playlist in the context of the description of FIG. 15B as a reshuffling of the pointers 1555.

Figure 16A:
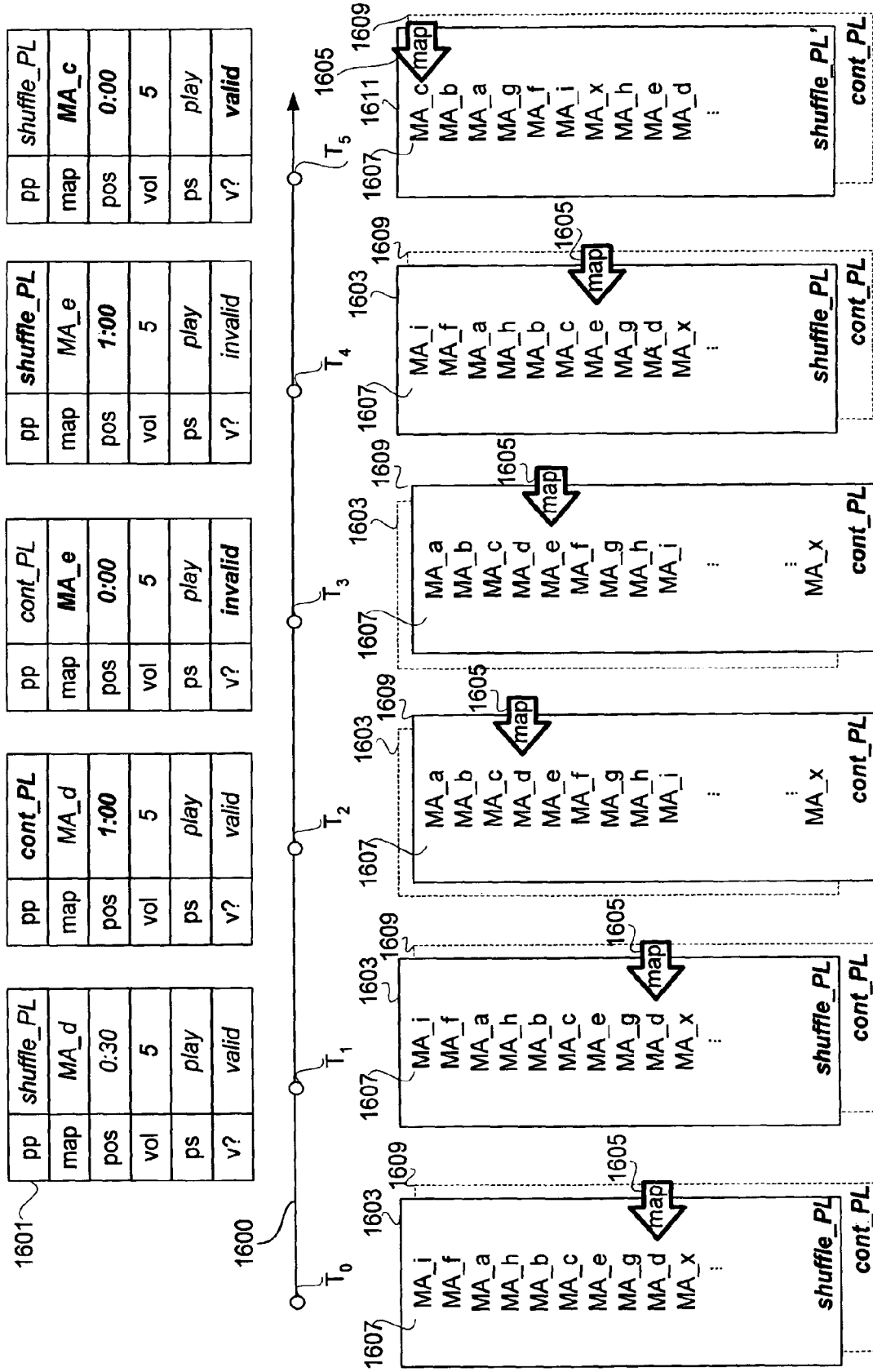
FIGS. 16A and 16B show an exemplary timeline that illustrates a series of states in a media player according to one embodiment of the invention.
Figure 16B:
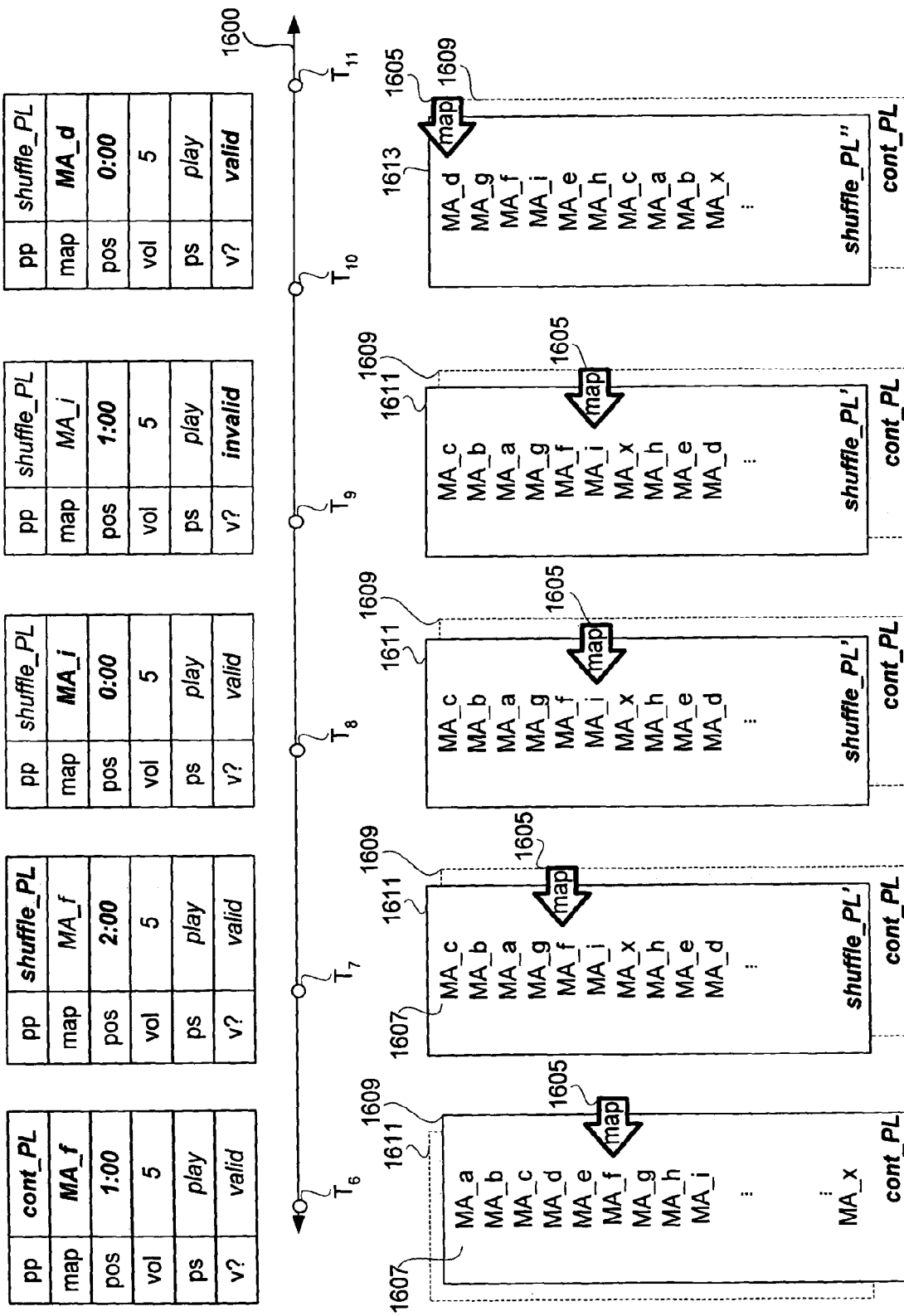

FIGS. 16A and 16B show an exemplary timeline 1600 that illustrates a series of states in a media player according to one embodiment of the invention. Indicated times on the timeline (labeled $T_n$, where n is an integer) each correspond with a snapshot 1601 of a set of state variables and a media asset playlist. The state variables (media player status information, such as media player state indicators) shown in FIGS. 16A and 16B, as well as exemplary playlists, are shown and discussed above with reference to Table 1 and FIGS. 11-14B, 15A and 15B. These examples demonstrate the traversal of different media asset playlists using a media player, for example the media player 100 depicted in FIG. 1. Further, these examples include sample snapshots 1601 of state variables stored or utilized by the power on and power down processes described in FIGS. 11 and 12.

Table 2 shows a list of state variables and associated abbreviations for each. Values for each state variable are shown on FIGS. 16A and 16B for each snapshot 1601.

TABLE 2

| | |
|---|---|
| pp | Playlist pointer |
| map | Media asset pointer |
| pos | Media asset position |
| vol | Volume |
| ps | Play status |
| v? | Playlist validity indicator |

Further, at each time $T_n$ on the timeline, a media asset shuffle playlist 1603 is shown. The media asset shuffle playlist 1603 can have the features of the media asset shuffle playlist 1551 of FIG. 15B. However, for ease of illustration, each media asset label shown is an actual media asset 1607 rather than a pointer to a media asset. The media assets 1607 are shown out of sequence to simulate the random ordering of the media asset shuffle playlist. A media asset pointer (map) 1605 is shown as well. The media asset pointer 1605 indicates the current media asset 1607 being played.

As noted above in reference to FIG. 15B, a shuffle playlist 1603 can be associated with a continuous playlist 1609. As discussed above in reference to FIG. 15, the order of media assets on the continuous playlist is typically not alterable by an operator of the media player. Therefore, for the purposes of FIGS. 16A and 16B, it is assumed that the continuous playlist does not change regardless of how often the shuffle playlist 1603 changes.

The timeline begins at $T_0$, with an initial media player state being 'off'. At $T_0$, all state variables are stored in persistent memory.

At $T_1$, the media player is powered on and switched to shuffle mode. Upon loading the state variables in the snapshot 1601 shown for $T_1$, the media player begins to traverse the shuffle playlist shown at $T_1$. Specifically, the media player starts at a point 30 seconds into media asset MA_d. This indicates that, at some $T_P$ before $T_0$, the media player was powered off after playing 30 seconds of the media asset MA_d, and that the state variables indicating the media player status at $T_P$ were stored before the media player was powered off.

At $T_2$, 30 seconds after $T_1$, a user sets the media player to continuous mode. The value of the playlist pointer (pp) is changed to cont_PL, indicating that the continuous playlist 1609 is now selected. However, the media player continues to present (play) the media asset 1607 that the media asset pointer 1605 was pointing at (MA_d) on the shuffle playlist 1603 until the end of the media asset 1607 is reached.

At time $T_3$, a transition is reached at the end of media asset MA_d. Hence, the current media shuffle playlist becomes invalid and the playlist validity indicator is set to 'invalid'. Further, since the media player was set to continuous mode at $T_2$, MA_e (the next media asset 1607 on the continuous playlist 1609), is presented, rather than MA_b, which was the next media asset 1607 on the now-invalid shuffle playlist.

Note that, if the media player remains in continuous mode, the continuous playlist is traversed sequentially (MA_f, MA_g, etc.).

One minute into playing of the media asset MA_e, at time $T_4$, the user of the media player switches the media player back to shuffle mode. Accordingly, the playlist pointer is set back to shuffle_PL.

At time $T_5$, a transition is reached at the end of media asset MA_e. Since the media player is in shuffle mode, the media player attempts to traverse the shuffle playlist. However, the playlist validity indicator was set to 'invalid' at $T_3$, so a new shuffle playlist 1611 (shuffle_PL') is created. Thus, the new shuffle playlist 1611 is created and the media asset pointer is moved to MA_c, which is a first media asset 1607 on the new shuffle playlist 1609.

Timeline 1600 continues on FIG. 16B. Between time $T_5$ and time $T_6$, the shuffle playlist 1611 is traversed normally (i.e., media assets on the shuffle playlist are presented in sequence). Thus, at time $T_6$, the media asset pointer 1607 has moved such that it now points to MA_f, as shown. Also, at time $T_6$, the user once again switches the media player to continuous mode, so the playlist pointer is changed to point to cont_pl. However, before the end of MA_f is reached, the user switches the media player back to shuffle mode at time $T_7$. Therefore, since the transition at the end of MA_f was never reached, the shuffle playlist 1611 remains valid, as indicated by the playlist validity indicator. Accordingly, at time $T_8$, the media asset pointer 1605 moves to the MA_i, the next media asset 1607 on the shuffle playlist 1611.

At time $T_9$, the user requests a new shuffle playlist. The new shuffle playlist request causes the shuffle playlist 1611 to be invalidated, as indicated by setting the validity indicator to 'invalid'. When the next transition (between MA_i and MA_x) is reached at time $T_{10}$, a new shuffle playlist 1613 (shuffle_PL'') is created and the media asset pointer 1605 is set point to MA_d, which is the first media asset 1607 on the new shuffle playlist 1613.

Finally, at time $T_{11}$, the user powers off the media player. Before the media player powers off, it saves the current state variables as media asset status indicators in persistent memory (see FIG. 12).

Examples of ornamental designs for a media device, such as those illustrated in FIGS. 2A and 2B, are provided in (i) U.S. Design patent application Ser. No. 29/220,035, filed Dec. 23, 2004, entitled "ELECTRONIC DEVICE," which is hereby incorporated herein by reference; (ii) U.S. Design patent application Ser. No. 29/220,120, filed Dec. 23, 2004, entitled "ELECTRONIC DEVICE," which is hereby incorporated herein by reference; and (iii) U.S. Design patent application Ser. No. 29/220,038, filed Dec. 23, 2004, entitled "ELECTRONIC DEVICE," which is hereby incorporated herein by reference.

Although the media items (or media assets) of emphasis in several of the above embodiments were audio items (e.g., audio files or songs), the media items are not limited to audio items. For example, the media items can alternatively pertain to videos (e.g., movies) or images (e.g., photos).

The various aspects, features, embodiments or implementations of the invention described above can be used alone or in various combinations.

The methods of this invention can be implemented by software, hardware or a combination of hardware and software. The invention can also be embodied as computer readable code on a computer readable medium. The computer readable medium is any data storage device that can store data which can thereafter be read by a computer system, including both transfer and non-transfer devices as defined above. Examples of the computer readable medium include read-only memory, random-access memory, CD-ROMs, Flash memory cards, DVDs, magnetic tape, optical data storage devices, and carrier waves. The computer readable medium can also be distributed over network-coupled computer systems so that the computer readable code is stored and executed in a distributed fashion.

The many features and advantages of the present invention are apparent from the written description and, thus, it is intended by the appended claims to cover all such features and advantages of the invention. Further, since numerous modifications and changes will readily occur to those skilled in the art, the invention should not be limited to the exact construction and operation as illustrated and described. Hence, all suitable modifications and equivalents may be resorted to as falling within the scope of the invention.

What is claimed is:

1. A handheld electronic device, comprising:
   a housing;
   a center button including a first movable platform that moves relative to the housing in order to actuate a switch disposed between the first movable platform and the housing or structural component attached to the housing, moving the first movable platform compresses the switch thereby causing an input signal to be generated; and
   an outer multifunctional button surrounding the center button and including a second movable platform that tilts relative to the housing in order to actuate one or more mechanical switches disposed between the second movable platform and the housing or structural component attached to the housing, tilting the second movable platform at button regions compresses one or more of the actuators, thereby causing various input signals to be generated, the second movable platform protruding though an opening in the housing, and providing a tactile surface for actuating the various button regions of the second movable platform, wherein the second movable platform includes a cosmetic layer that is attached to the top surface of a rigid plate, with the cosmetic layer protruding through the opening in the housing and providing the tactile surface wherein a button cap associated with the center button is disposed between the cosmetic layer and the top side of the rigid plate, a top portion of the button cap is configured to protrude through an opening in the cosmetic layer while a flange portion is retained in a space formed between the cosmetic layer and the top surface of the rigid plate, and the top portion of the button cap may be pushed to activate a switch located underneath the button cap.

2. The handheld electronic device as recited in claim 1 wherein the second movable platform is movably coupled to the housing.

3. The handheld electronic device as recited in claim 1 wherein the housing movably restrains a floating second movable platform.

4. The handheld electronic device as recited in claim 1 wherein the mechanical switches associated with the second movable platform are attached to the housing.

5. The handheld electronic device as recited in claim 1 wherein the mechanical switches associated with the second movable platform are attached to the second movable platform.

6. The handheld electronic device as recited in claim 1 wherein the switches include spring biased actuators that they extend away from the mechanical switch and bias the platforms in the upright position.

7. The handheld electronic device as recited in claim 6 wherein the mechanical switches are attached to the backside of the second movable platform such that the actuators act as legs for supporting the second platform in its upright position within the housing.

8. The handheld electronic device as recited in claim 1 wherein the second movable platform is movably restrained within a cavity provided in the housing.

9. The handheld electronic device as recited in claim 7 wherein the second movable platform is surrounded by side walls, a top wall and bottom wall of the housing, the side walls are configured to substantially prevent movements in the x and y directions as well as rotations about the z axis excluding a small gap that allows a slight amount of play in order to prevent the second movable platform from binding with the housing during the tilting action, the top and bottom walls are configured to allow limited movement in the z direction as well as rotation about the x and y axis in order to provide the tilting action, a spring force is provided for places a top surface of the second movable platform into mating engagement with a bottom surface of the top wall of the housing.

10. The handheld electronic device as recited in claim 1 wherein both of the center button and outer multifunctional button are adapted to be readily manipulated by a finger or thumb of a user while the user holds the handheld electronic device in the same hand that includes the finger or thumb.

11. The handheld electronic device as recited in claim 10 wherein both of the center button and outer multifunctional button are adapted to be readily manipulated by a thumb of a user while the user holds the handheld electronic device in the fingers and palm of the same hand that includes the thumb.

12. The handheld electronic device as recited in claim 10, further including:
   one or more output devices placed at locations on the housing that are readily accessible to the user while the user holds the handheld electronic device.

13. The handheld electronic device as recited in claim 12 wherein the output devices are placed above the center button and outer multifunctional button, whereby the output devices are readily accessible to the user while the user holds the handheld electronic device and also manipulates one of the center button and outer multifunctional button.

14. The handheld electronic device as recited in claim 1 wherein the housing includes a cavity that contains the second movable platform, wherein the housing includes a lip that extends over and restrains an outer portion of the top surface of the second movable platform.

15. The handheld electronic device as recited in claim 1 wherein the cosmetic layer protrudes through the opening in the housing and no part of the rigid plate protrudes through the opening in the housing.

16. A handheld electronic device, comprising:
a housing;
a center button including a first movable platform that moves relative to the housing in order to actuate a switch disposed between the first movable platform and the housing or structural component attached to the housing, moving the first movable platform compresses the switch thereby causing an input signal to be generated; and
an outer multifunctional button surrounding the center button and including a second movable platform that tilts relative to the housing in order to actuate one or more mechanical switches disposed between the second movable platform and the housing or structural component attached to the housing, tilting the second movable platform at button regions compresses one or more of the actuators, thereby causing various input signals to be generated, the second movable platform protruding though an opening in the housing, and providing a tactile surface for actuating the various button regions of the second movable platform, wherein the second movable platform includes a cosmetic layer that is attached to the top surface of a rigid plate, the cosmetic layer protruding through the opening in the housing, and providing a tactile surface for actuating the various button regions of the second movable platform,
wherein a button cap associated with the center button is disposed between the cosmetic layer and the top side of the rigid plate, a top portion of the button cap is configured to protrude through an opening in the cosmetic layer while a flange portion is retained in a space formed between the cosmetic layer and the top surface of the rigid plate, and the top portion of the button cap may be pushed to activate a switch located underneath the button cap.

17. A clickable button actuator for interacting with a handheld electronic device, comprising:
a center button; and
a plurality of protruding peripheral buttons immediately adjacent to and that surround the center button, the protruding peripheral buttons being integrated into a single movable member that is tilted or depressed in order to implement a distinct clicking action, wherein the single movable member includes a cosmetic layer that is attached to the top surface of a rigid plate, with the cosmetic layer being adapted to protrude through an opening in the handheld electronic device and provide a tactile surface for a user thereof wherein a button cap associated with the center button is disposed between the cosmetic layer and the top side of the rigid plate, a top portion of the button cap is configured to protrude through an opening in the cosmetic layer while a flange portion is retained in a space formed between the cosmetic layer and the top surface of the rigid plate, and the top portion of the button cap may be pushed to activate a switch located underneath the button cap.

18. The clickable button actuator as recited in claim 17 having a circular arrangement.

19. The clickable button actuator as recited in claim 17 wherein both of the center button and plurality of protruding peripheral buttons are adapted to be readily manipulated by a thumb of a user while the user holds the handheld electronic device in the fingers and palm of the same hand that includes the thumb.

\* \* \* \* \*

UNITED STATES PATENT AND TRADEMARK OFFICE
CERTIFICATE OF CORRECTION

| | | |
|---|---|---|
| PATENT NO. | : 7,889,497 B2 | Page 1 of 1 |
| APPLICATION NO. | : 11/830746 | |
| DATED | : February 15, 2011 | |
| INVENTOR(S) | : Steve Jobs et al. | |

It is certified that error appears in the above-identified patent and that said Letters Patent is hereby corrected as shown below:

On page 4, in column 1, under "Other Publications", line 33, delete "electron s" and insert -- electronic --, therefor.

On page 4, in column 2, under "Other Publications", line 12, delete "peropherals" and insert -- peripherals --, therefor.

On page 5, in column 1, under "Other Publications", line 29, delete "Pervasice" and insert -- Pervasive --, therefor.

On page 5, in column 2, under "Other Publications", line 30, delete "Motorla" and insert -- Motorola --, therefor.

In column 10, line 32, delete "slideably" and insert -- slidably --, therefor.

In column 12, line 50, delete "though" and -- through --, therefor.

In column 16, line 39, delete "removeably" and insert -- removably --, therefor.

In column 29, line 55, in claim 1, delete "though" and insert -- through --, therefor.

In column 31, line 23, in claim 16, delete "though" and insert -- through --, therefor.

Signed and Sealed this
Fifteenth Day of November, 2011

David J. Kappos
*Director of the United States Patent and Trademark Office*